United States Patent
Shimizu et al.

[11] Patent Number: 6,025,562
[45] Date of Patent: Feb. 15, 2000

[54] ELECTRONIC EQUIPMENT AND METHOD OF MANUFACTURING THE SAME

[75] Inventors: Takeshi Shimizu; Hideo Uda; Giichi Konishi; Kyouji Kitamura; Kazuhiro Hayashi; Chikashi Niimi; Toshiki Kitani; Satoshi Noda, all of Kyoto, Japan

[73] Assignee: OMRON Corporation, Kyoto, Japan

[21] Appl. No.: 08/809,176

[22] PCT Filed: Jul. 18, 1996

[86] PCT No.: PCT/JP96/01997

§ 371 Date: Mar. 18, 1997

§ 102(e) Date: Mar. 18, 1997

[87] PCT Pub. No.: WO97/04473

PCT Pub. Date: Feb. 6, 1997

[30] Foreign Application Priority Data

Jul. 18, 1995 [JP] Japan .................................. 7-205321
Jul. 28, 1995 [JP] Japan .................................. 7-212884

[51] Int. Cl.[7] .................................................. H05K 5/00
[52] U.S. Cl. ...................................... 174/175 F; 174/52.2
[58] Field of Search ................................ 174/17 SF, 52.2

[56] References Cited

U.S. PATENT DOCUMENTS

| | | |
|---|---|---|
| 3,889,365 | 6/1975 | Brock .................................. 174/52.2 X |
| 4,788,626 | 11/1988 | Neidig et al. ...................... 174/52.2 X |
| 5,438,162 | 8/1995 | Thompson et al. .................... 174/52.2 |
| 5,594,204 | 1/1997 | Taylor et al. ......................... 174/52.2 |

FOREIGN PATENT DOCUMENTS

| | | |
|---|---|---|
| 55-47178 | 3/1980 | Japan . |
| 58-134845 | 9/1983 | Japan . |
| 5-6625 | 1/1993 | Japan . |

*Primary Examiner*—Dean A. Reichard
*Attorney, Agent, or Firm*—Foley & Lardner

[57] ABSTRACT

An electronic equipment such as a proximity sensor. A groove for discharging air is formed at coil casing (7) arranged at a front surface of the proximity sensor. An opening (43) is formed at a clamp portion (9) holding a code (10) behind a metal casing (8). The proximity sensor (1) is held at a low pressure, and resin is supplied through the opening (43) at the clamp portion (9), whereby the casing can be filled with the resin in a short time.

5 Claims, 35 Drawing Sheets

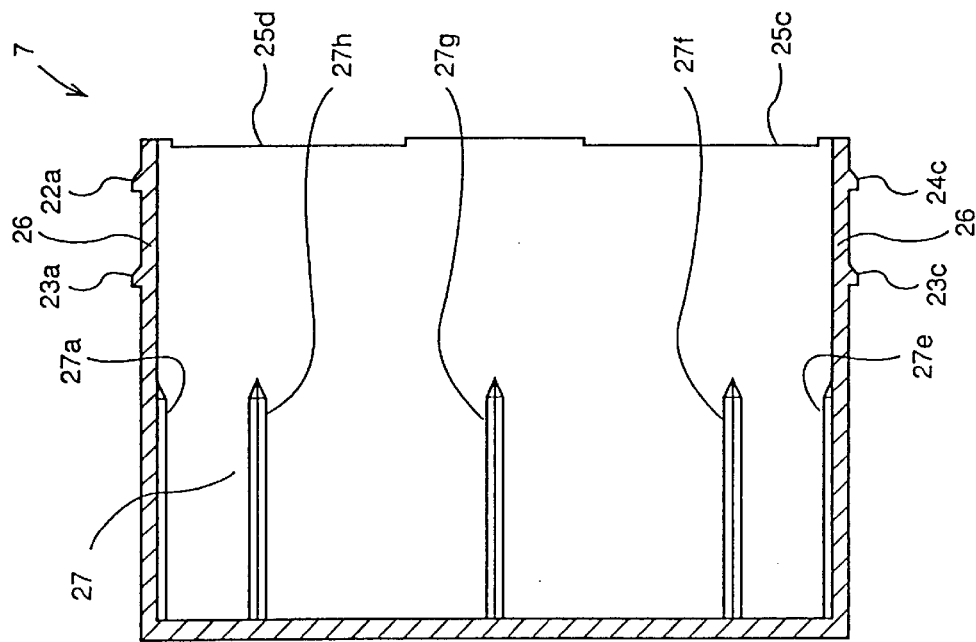
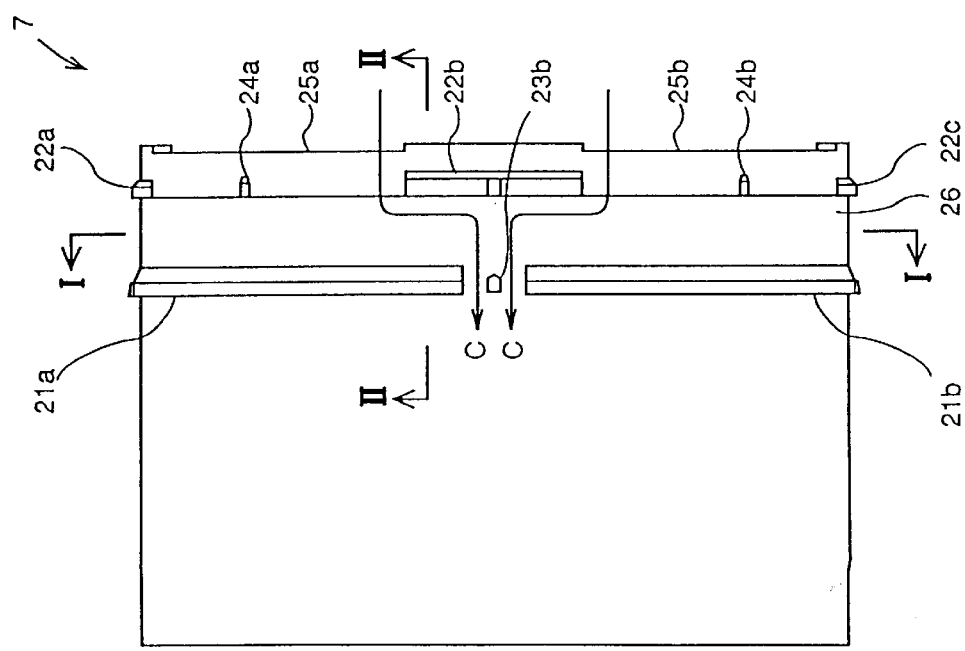

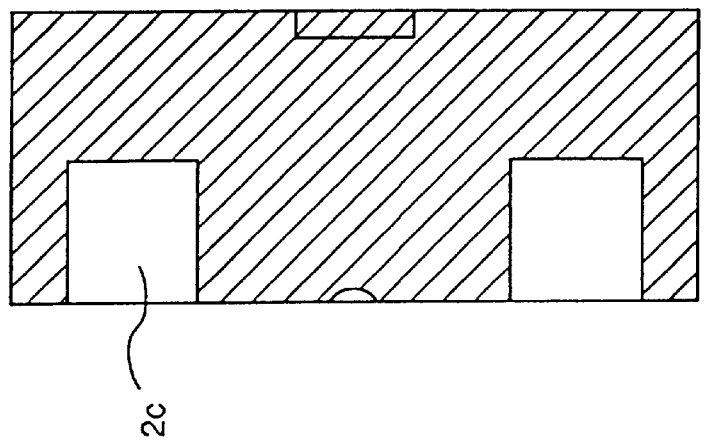
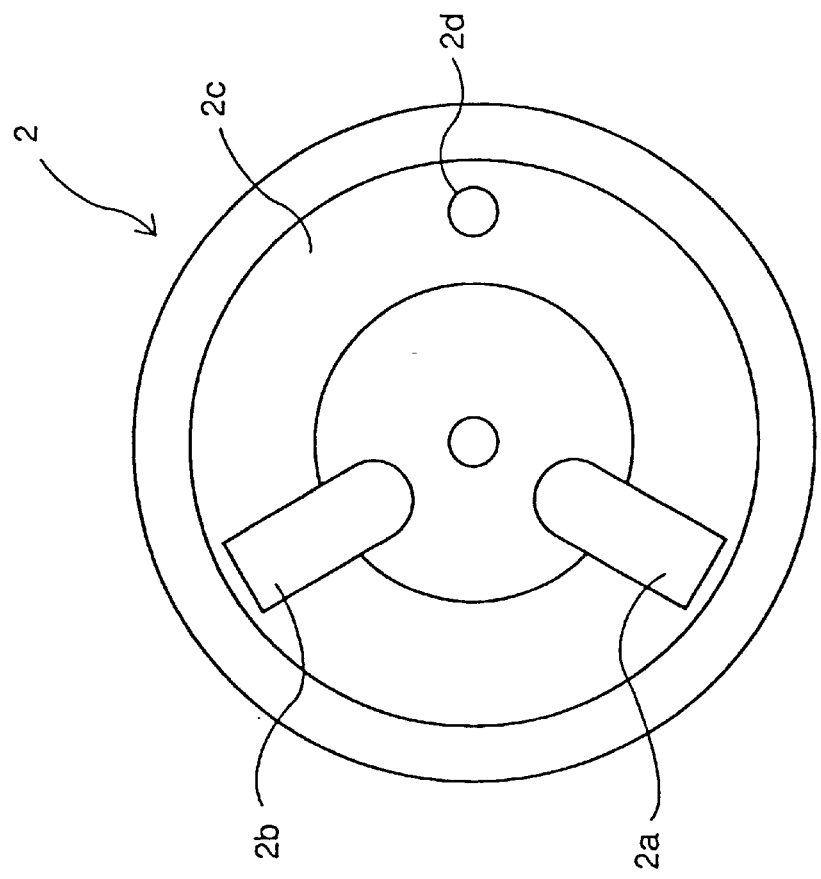

ELECTRONIC EQUIPMENT AND METHOD OF MANUFACTURING THE SAME

TECHNICAL FIELD

The present invention relates to an electronic component such as a proximity sensor as well as a method of manufacturing the same, and in particular to a structure of an electronic component provided with a casing filled with resin as well as a method of manufacturing such an electronic component.

BACKGROUND ART

FIG. 35 is a cross section showing an example of a proximity sensor of a high-frequency oscillation type in the prior art. A conventional proximity sensor 101 includes a core 102 provided with an annular groove, in which a coil 104 held by a coil spool 103 is buried. Core 102 is held at a front surface of a coil casing 105 made of resin as shown in the figure, and these parts are accommodated in a base member, i.e., metal casing 106. A reference number 107 indicates an electronic circuit which includes an oscillator circuit including coil 104 as well as a signal processor unit for detecting lowering of its oscillation amplitude, and is mounted on a printed board 108. After coil 104 is connected to printed board 108, primary filler resin 109 is supplied into a portion of coil casing 105 near core 102 for stabilizing performance. In order to improve environmental resistance, epoxy resin 110 is supplied into the casing of the proximity sensor. When supplying epoxy resin 110, it is hot and, for example, an injector is used. A clamp portion 111 holds a code 112 to complete the proximity sensor. Alternatively, there has been a proximity sensor, in which a casing is not filled with resin in a sealed manner, and thermoplastic resin is used to form an integral structure. A display element 113 is mounted on printed board 108, and light beams emitted therefrom are led externally through a transparent light conducting portion 114.

For filling the casing of the proximity sensor with the resin, primary filler resin 109 of a low viscosity is injected into the coil casing 105, and coil 104 held by core 102 is inserted into the resin. Then, metal casing 106 is fitted to the coil casing 105, and epoxy resin 110 is injected again. In this conventional manner of filling the structure with resin, many steps are required for resin injection, and a long time is required for hardening.

The conventional proximity sensor requires a preliminary process such as stirring of resin to be injected. Even if the filler resin is injected into the casing with an injector or the like, it shrinks when hardened, so that additional resin must be injected to space formed by shrinkage. Therefore, many steps are required, and a long hardening time of about 1 hour is required. Further, in the case where thermoplastic resin is used for forming an integral structure, a high injection pressure is required for molding, so that accommodated parts may be impaired.

In the case where resin of a high viscosity is used as the filler resin for forming an integral structure, spaces around the coil casing, coil spool, core and others are not completely filled with the primary filler resin, and air remains in the primary molding dies. The remaining air expands due to a high temperature of the dies and a high temperature of the filler resin during the primary molding, and the coil casing may be deformed. The air remaining around the coil may cause unstable characteristics of the coil.

The present invention has been developed for overcoming the above disadvantages through low-pressure molding with thermoplastic resin, and has the following objects.

An object of the invention is to enable easy and reliable filling of a casing of an electronic component with resin. Another object of the invention is to simplify a resin filling process.

DISCLOSURE OF THE INVENTION

The invention provides an electronic component having a casing accommodating an electronic part and filled with resin, and including a resin inlet arranged at one end portion of the casing, and a passage arranged at the other end portion of the casing for communicating an interior and an exterior of the casing with each other. Since the passage for air is arranged remote from the resin inlet, air in the casing can be discharged through the passage to lower the pressure in the casing during supply of the resin. Therefore, resin can be easily and reliably supplied to portions, for example, around the electronic part in the casing, which cannot generally be filled with resin without difficulty. Further, the resin can be hardened in a short time, so that processing steps can be reduced in number, and a manufacturing time can be significantly reduced.

The passage arranged at the other end side of the casing may be arranged at a cover or lid covering an opening formed at the other end side of the casing. The passage formed at the other end side of the casing may be arranged between a cover over an opening formed at the other end portion of the casing and the casing. The resin inlet may be arranged at a clamp portion attached to an opening formed at the one end portion of the casing for holding a code. In a structure wherein a coil casing is arranged in the casing, the air passage may be formed of an air discharge groove arranged between a cylindrical casing and a coil casing. In a structure wherein a printed board and a shield film covering the printed board are arranged in a cylindrical casing, an opening may be formed at the shield film. The air passage may be formed by forming a linear projection at the coil casing.

The present invention also provides a method of manufacturing an electronic component wherein an electronic part is accommodated in a casing filled with resin and having a resin inlet at its one end portion and a passage at the other end portion for communicating an interior of the casing with an exterior of the same, the method including the steps of lowering a pressure in the casing by externally discharging air in the casing through the passage, and filling the casing with resin by supplying the resin. In this manner, the pressure in the casing is reduced for supply of the resin. Therefore, it is possible to supply reliably and easily the resin to a portion which cannot be generally filled with the resin without difficulty. In this case, the resin is hardened in a short time, so that the processing steps can be small in number, and the manufacturing time can be significantly reduced.

BRIEF DESCRIPTION OF THE DRAWINGS

FIG. 3a is a side view of a coil casing of the proximity sensor of the first embodiment.

FIG. 3b is a cross section of the coil casing of the proximity sensor of the first embodiment.

FIG. 19a is an elevation of the core in the fourth embodiment.

FIG. 19b is a cross section of the core in the fourth embodiment.

PREFERRED EMBODIMENTS FOR IMPLEMENTING THE INVENTION

Embodiments of the invention will be described below with reference to the drawings.

Figure 1:
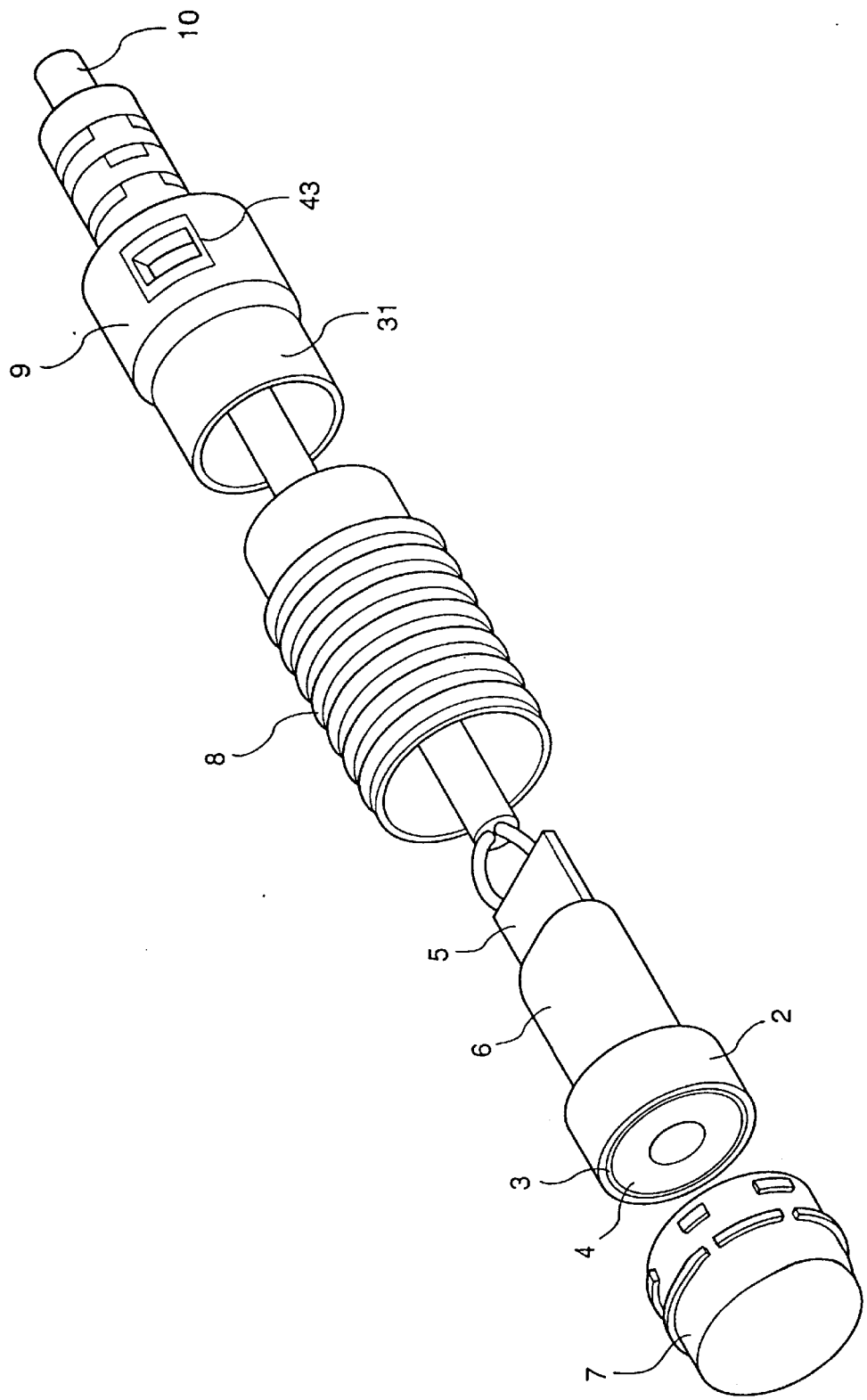
FIG. 1 shows a structure of a proximity sensor, before assembly, of a first embodiment of the invention.
Figure 2:
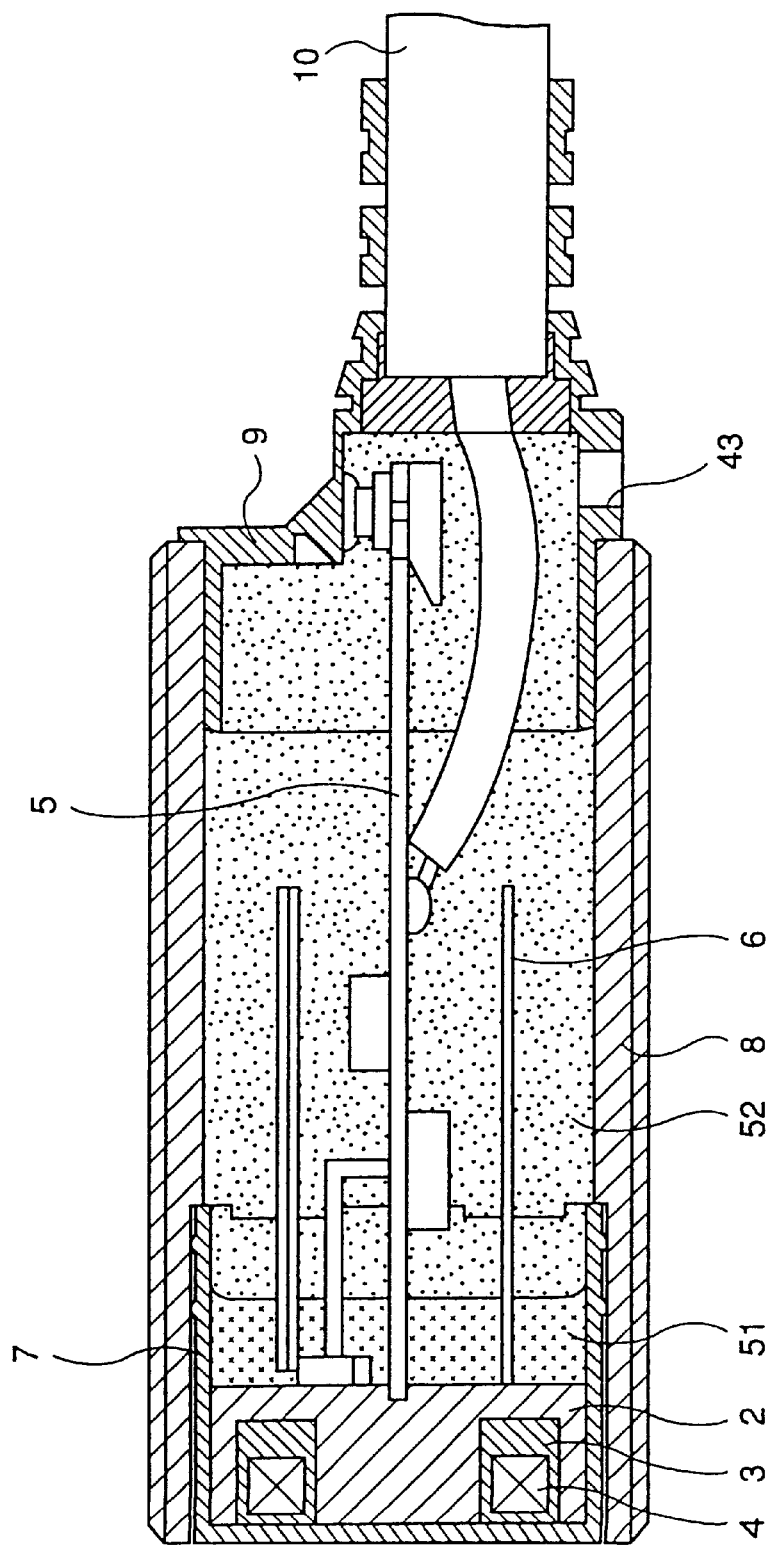
FIG. 2 is a cross section of the proximity sensor of the first embodiment.

FIG. 1 shows a structure of a proximity sensor, before assembly, of a first embodiment of the invention, and FIG. 2 is a cross section of the same. As shown in these figures, a proximity sensor 1 of this embodiment includes a core 2 provided with an annular groove. A coil 4 wound around a coil spool 3 is accommodated in the annular groove. To a rear surface of core 2 is connected an elongated printed board 5 as shown in the figure, and an oscillator circuitry on printed board 5 is covered with a shield film 6. Core 2 is accommodated in a coil casing 7. Coil casing 7 is a cylindrical member having a closed bottom and made of resin. Coil casing 7 is provided at a periphery of its axially inner portion with projections, which will be described later. Coil casing 7 is accommodated in a base member, i.e., a metal casing 8. Metal casing 8 is a cylindrical casing made of metal and is provided at its outer periphery with a thread groove. A clamp portion 9 is attached to the rear surface of casing 8. Clamp portion 9 is made of resin, and is provided for holding a code 10.

Figure 4:
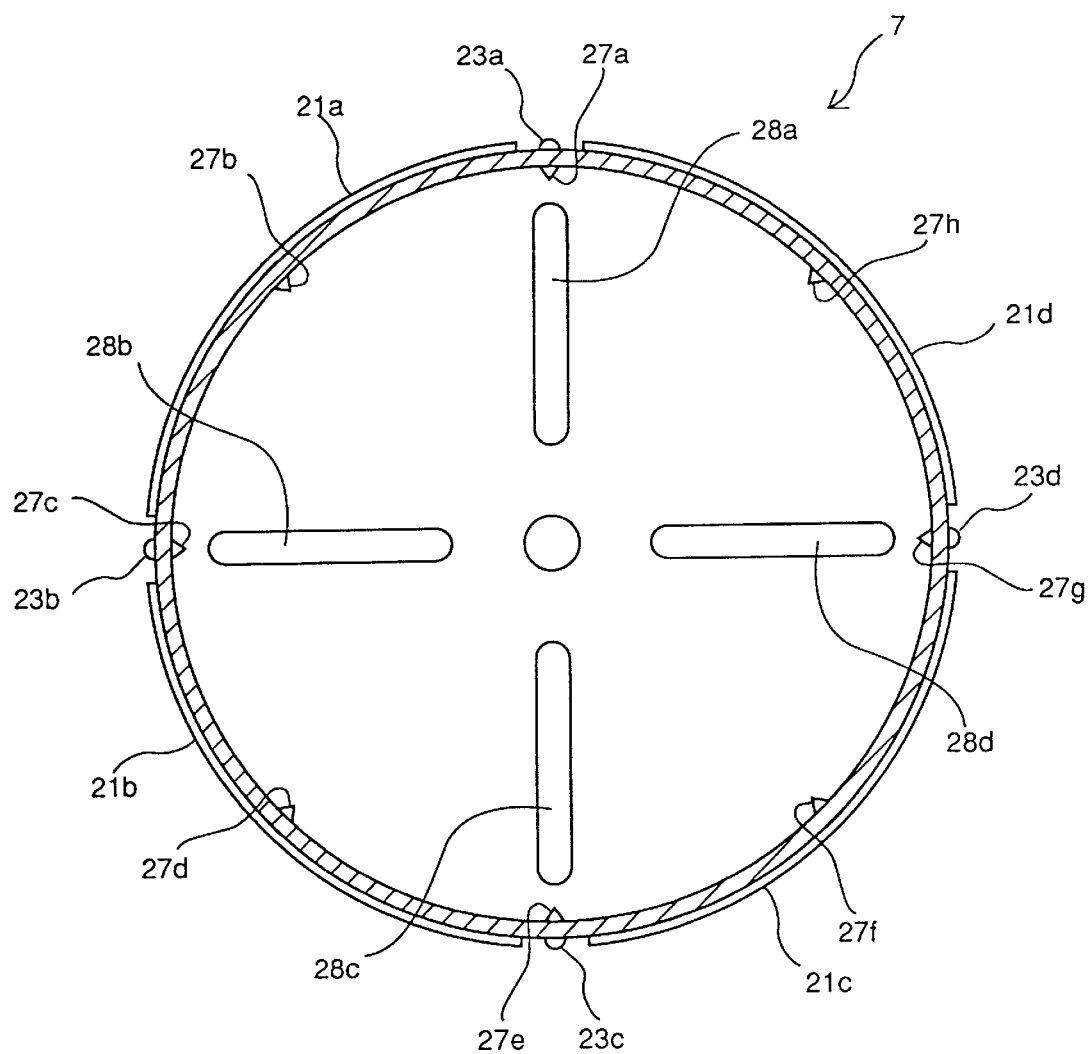
FIG. 4 is a cross section of the coil casing of the first embodiment taken along line II.
Figure 5:
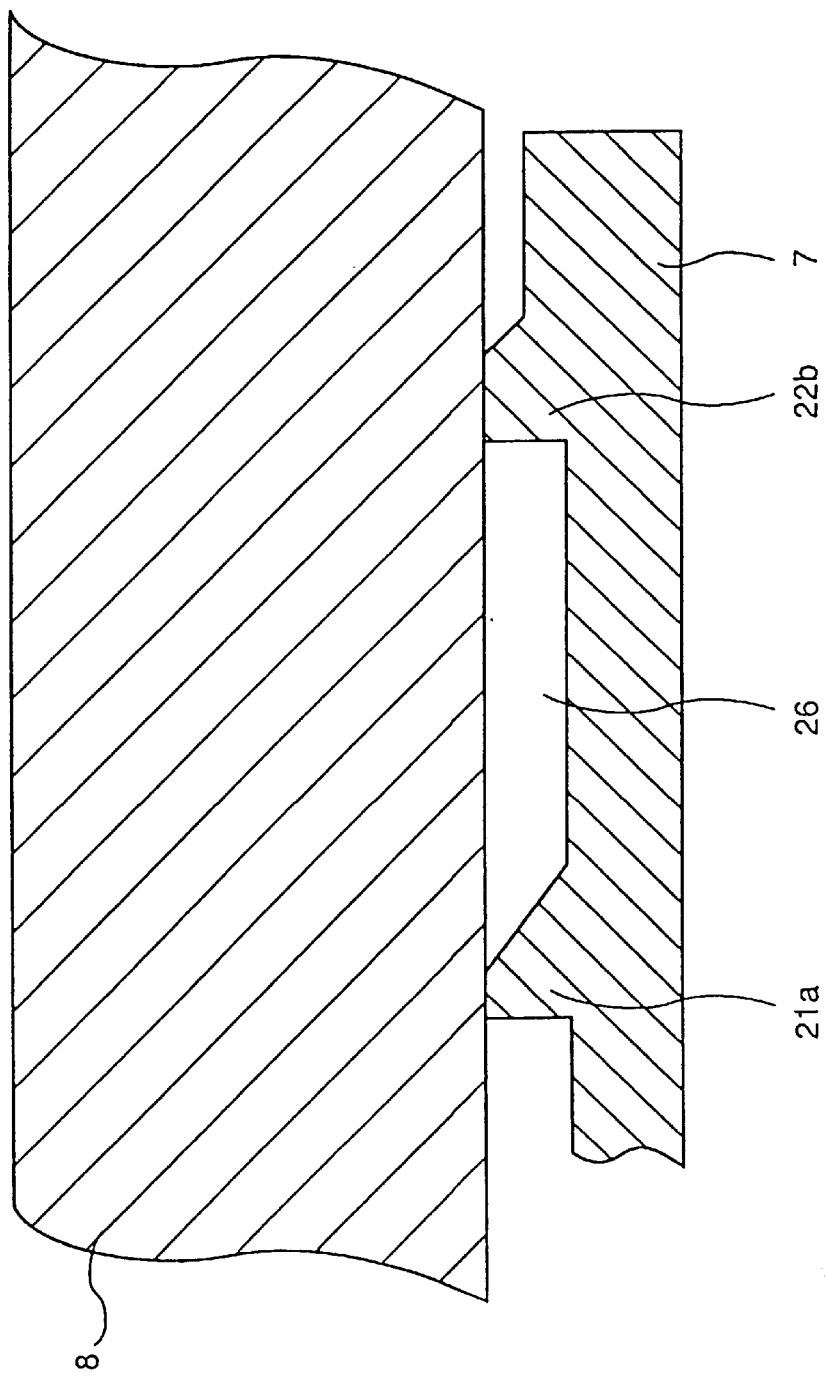
FIG. 5 is a cross section of the coil casing of the first embodiment taken along line B—B.

Coil casing 7 will be described below more in detail. Coil casing 7 is a cylindrical member having a closed front side, and thus has a substantially rectangular section with one side open, as can be seen from a side view of FIG. 3a and a cross section of FIG. 3b as well as FIG. 4 showing a section taken along line II and FIG. 5 showing, on an enlarged scale, a section taken along line B—B. Coil casing 7 is provided at its outer periphery of an axially inner surface portion, which is located inside ÷tal casing 8, with first linear projections 21a–21d for preventing leakage of resin as shown in the figures. A series of linear projections 21a–21d for preventing leakage of resin extend substantially entirely over an outer periphery of coil casing 7, and are interrupted at four positions. Axially inside projections 21a–21d, there are arranged second linear projections 22a–22d for preventing leakage of resin, each of which is shorter than the first projection and is axially opposed to a recess between circumferentially adjacent linear projections 21a–21d. The recesses between first and second linear projections 21a–21d and 22a–22d form grooves for discharging air. At positions axially corresponding to circumferentially middle positions of the recesses between linear projections 21a–21d, there are arranged projections 23a–23d each having the same height and an arc-shaped section, respectively. At middle positions between linear projections 22a–22d, there are arranged projections 24a–24d each having the same height and an arc-shaped section, respectively. These arc-shaped projections 22a–22d and 24a–24d are provided for holding coil casing 7 coaxially with metal casing 8 without inclining the coil casing 7, and thereby providing uniform grooves for discharging air in a process of forcedly fitting coil casing 7 into metal casing 8. An open end of coil casing 7 is provided at portions, which do not correspond to linear projections 22a–22d, with axially inward recesses 25a–25d, respectively, as shown in FIGS. 3a and 3b. When coil casing 7 is inserted into metal casing 8, it stops when its innermost end is brought into contact with a boundary at the end portion of metal casing 8 having a slightly reduced thickness. Thereby, recesses 25a–25d are provided for ensuring a passage for air flow, when coil casing 7 is accommodated in metal casing 8. A portion axially between linear projections 21a–21d and linear projections 22a–22d forms a groove 26 for accommodating or storing resin. Linear projections 21a–21d and 22a–22d have inclined surfaces at their axially inner sides, as can be seen from FIG. 5 showing, on an enlarged scale, a section taken along line II—II in FIG. 3a, and a thickness of the portion axially inside linear projections 22a–22d is larger than that of the portion axially outside the same.

As shown in FIG. 4, coil casing 7 is provided eight ribs 27a–27h located at positions, which axially correspond to the recesses between linear projections 21a–21d and intermediate portions of linear projections 21a–21d, respectively, and thus are circumferentially spaced by 45 degrees from each other. Ribs 27a–27h are formed at the inner periphery of the cylindrical portion of coil casing 7, and extend axially inward and therefore parallel with the cylinder axis from the front side of the proximity sensor. These ribs 27a–27h are provided for holding core 2 coaxially with coil casing 7. Further, coil casing 7 is provided at the inner surface of its front wall with linear projections 28a–28d arranged in a cross form. Ribs 27a–27h and linear projections 28a–28d are provided for ensuring an outlet of air flow in the process of injecting primary filler resin.

Figure 6B:
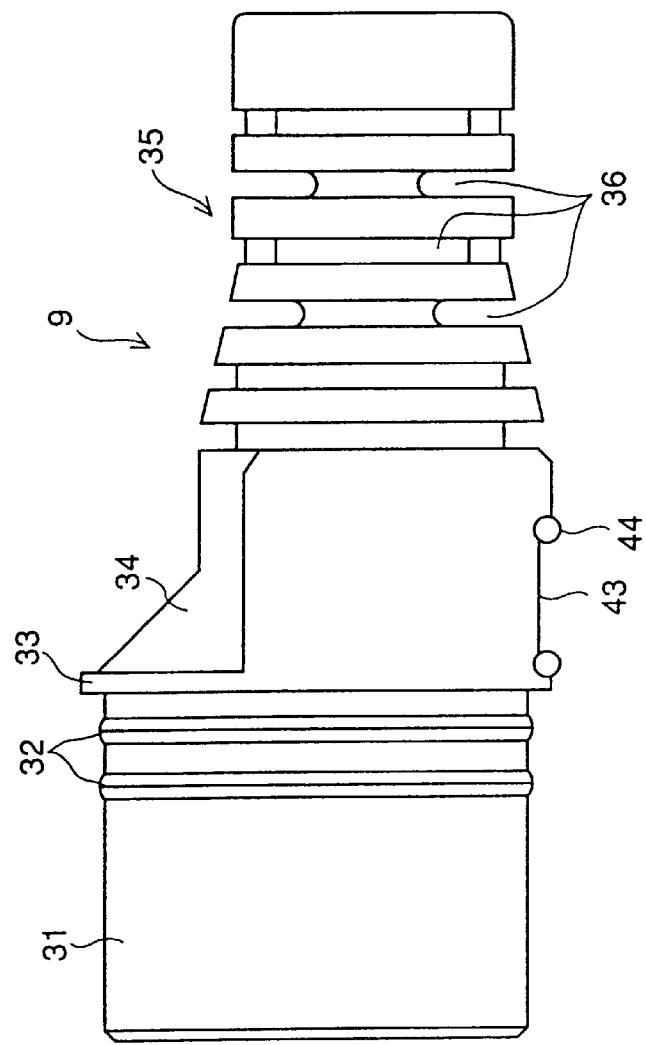
FIG. 6b is a side view of the clamp portion of the first embodiment.
Figure 6A:
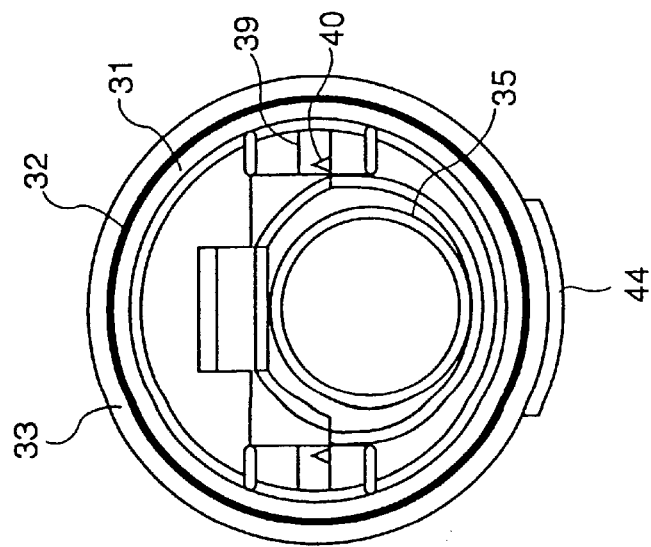
FIG. 6a is an elevation of a clamp portion of the first embodiment.
Figure 7A:
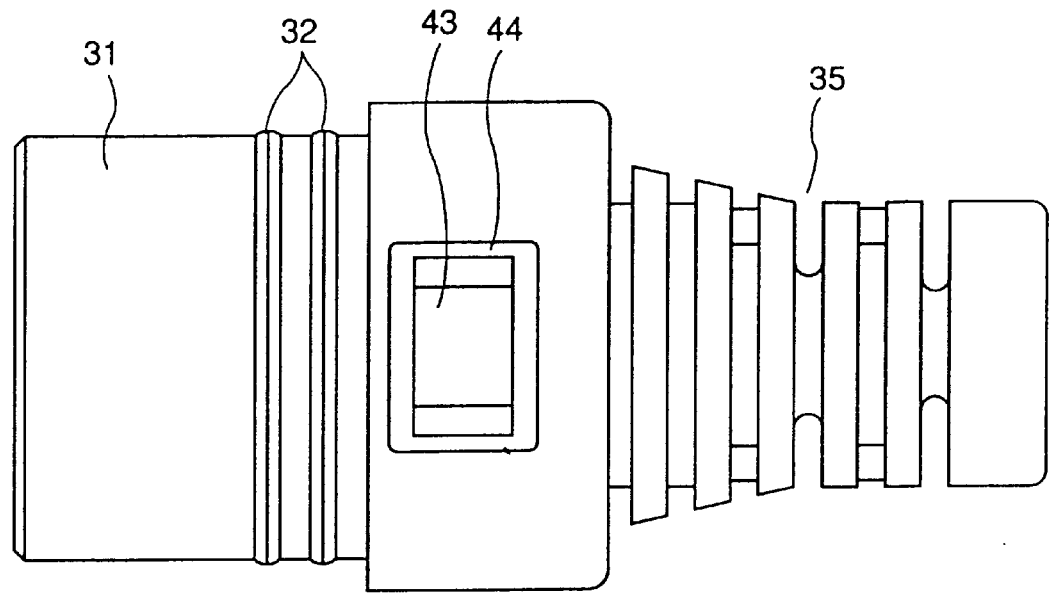
FIG. 7a is a bottom view of the clamp portion of the first embodiment.
Figure 7B:
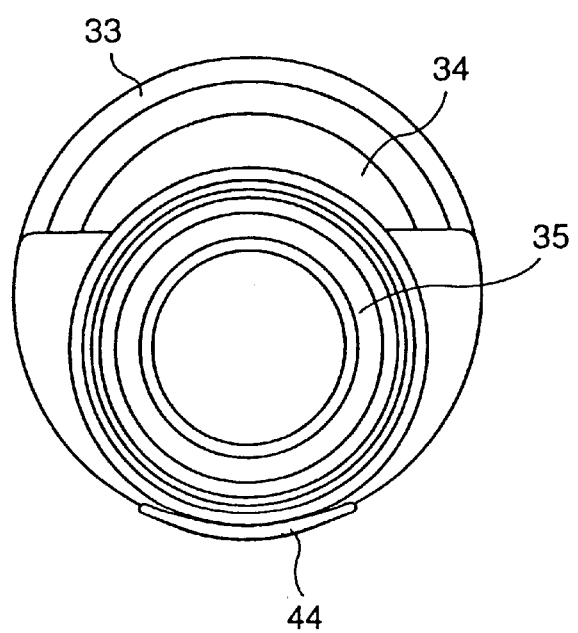
FIG. 7b is a rear view of the clamp portion of the first embodiment.
Figure 8:
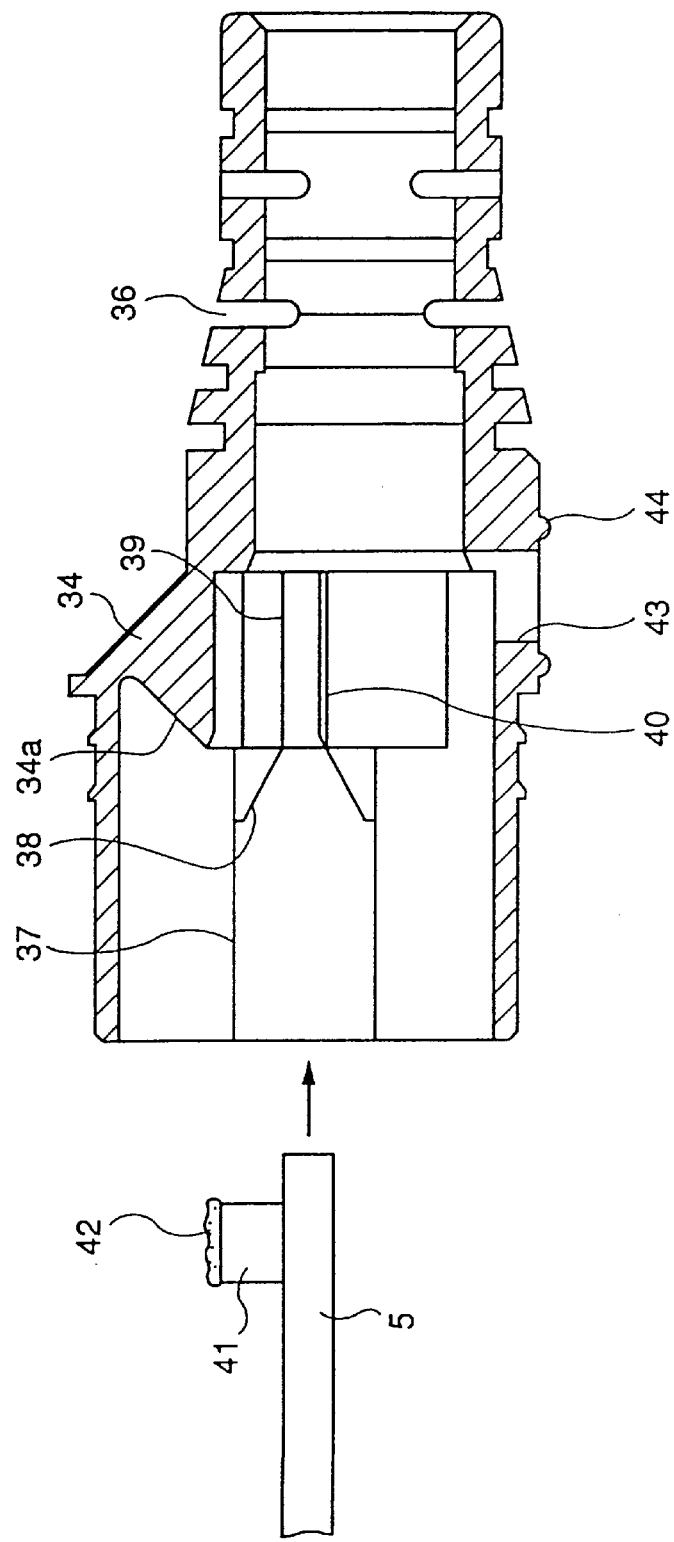
FIG. 8 is a cross section of the clamp portion of the first embodiment.
Figure 9:
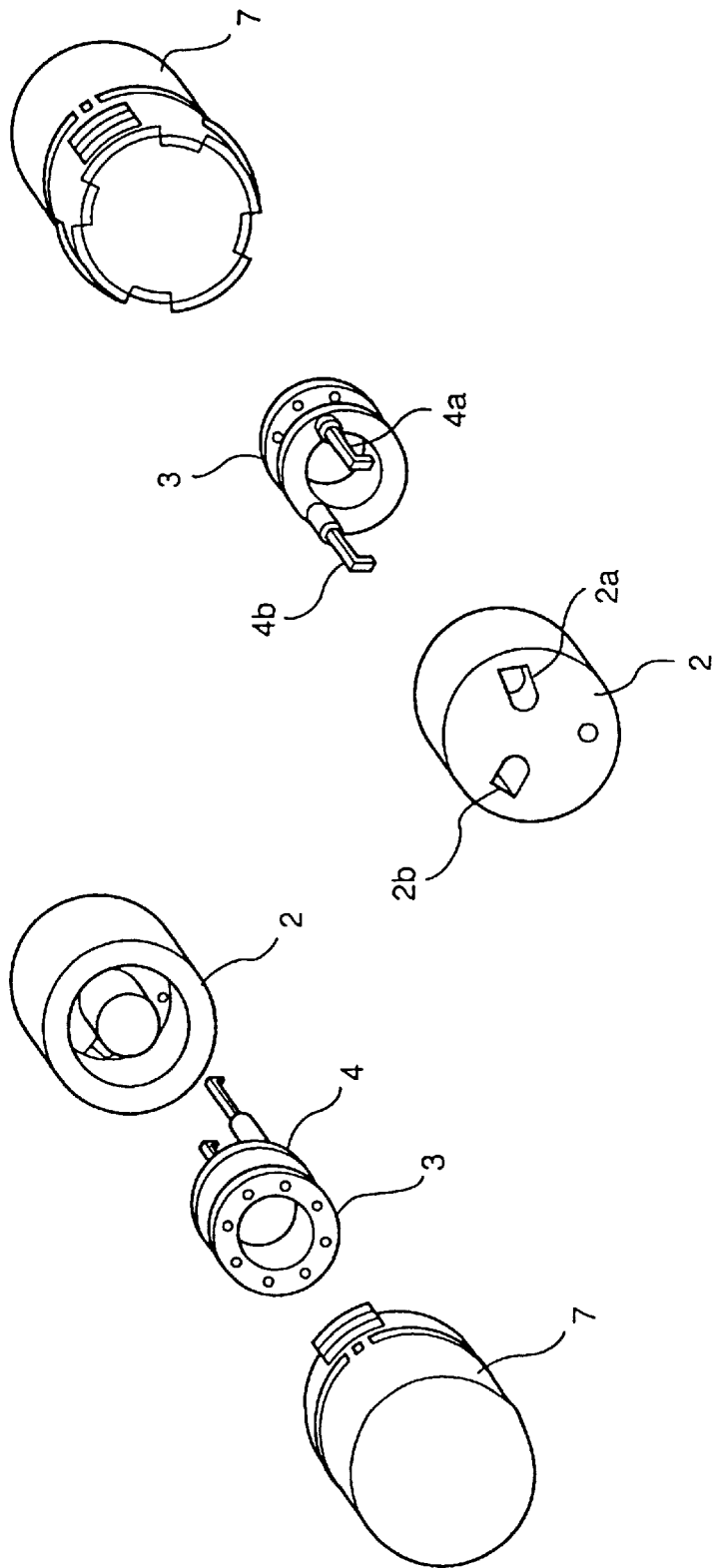
FIG. 9a shows a core and a coil to be accommodated in the coil casing of the first embodiment before assembly.
FIG. 9b shows the core and the coil to be accommodated in the coil casing of the first embodiment before assembly.

A specific structure of clamp portion 9 will be described below with reference to FIGS. 6 to 9. FIG. 6a is an elevation, FIG. 6b is a side view, FIG. 7a is a bottom view, FIG. 7b is a rear view, and FIG. 8 is a cross section of clamp portion 9. Clamp portion 9 has a cylindrical portion 31 located in metal casing 8. Cylindrical portion 31 has the substantially same outer diameter as the inner diameter of metal casing 8 and is provided at its axially inner portion with two belt-like projections 32. A flange 33 is arranged behind projections 32. A light conducting portion 34, which has a substantially half conical form and a substantially triangular section as shown in FIG. 8, is formed axially behind flange 33. A code holding portion 35 is arranged behind light conducting portion 34 for elastically holding code 10. Code holding portion 35 is provided with slit-like openings 36 which are equally spaced from each other. Code holding portion 35 has an inner diameter corresponding to the outer diameter of code 10 as shown in FIGS. 6a and 7b.

Cylindrical portion 31 inserted into metal casing 8 is provided at its inner surface with guide grooves 37 and tapered portions 38 for guiding opposite edges of printed board 5 of the proximity sensor, as can be seen from the section of FIG. 8. Tapered portion 38 is provided at its axially innermost portion with board holding grooves 39. Board holding groove 39 has a width substantially equal to a thickness of printed board 5, and is provided with a linear projection 40 as shown in the figure. Linear projection 40 is adapted to be deformed by printed board 5 inserted into to groove 39, and thereby fixes printed board 5. Printed board 5 which is held in board holding grooves 39 is opposed to the inner surface of light conducting portion 34. A display element 41 such as an LED is mounted on the portion of printed board 5 opposed to the light conducting portion 34. When printed board 5 provided with display element 41 is fitted into board holding grooves 39 through guide grooves 37, the upper surface of display element 41 is substantially brought into contact with the inner surface of light conducting portion 34. Even in the case where a gap is formed between them, light beams can be externally emitted from display element 41 by arranging a thick layer of transparent resin 42 on the upper surface of display element 41 as shown in FIG. 8. More specifically, the light beams emitted from display element 41 are led to light conducting portion 34 through transparent resin 42 and then are externally emitted directly through light conducting portion 34 or after being reflected by a reflection surface 34a.

In clamp portion 9a, as can be seen from the rear view of FIG. 7a, side portions of flange 33 have larger diameter, and is provided at its rear surface with an inward opening 43. A rim 44 is formed at the edge of opening 43 as shown in FIG. 6b. Opening 43 is provided for internally injecting filler resin, as will be described later.

FIG. 9a shows a structure before assembly, and specifically shows core 2 to be accommodated in coil casing 7 and coil 4 wound around coil spool 3. FIG. 9b shows the same structure viewed at a reverse angle. As can be seen from these figures, core 2 has the annular groove, and also has through-apertures 2a and 2b at its rear surface. Through through-apertures 2a and 2b, leads 4a and 4b at opposite ends of the coil 4 are extended from an end of the coil spool, and are connected to the oscillator circuit (not shown) on the printed board.

A process of manufacturing the proximity sensor of this embodiment will be described below. Coil 4 wound around coil spool 3 is put into the annular groove of core 2. Leads 4a and 4b at the opposite ends of coil 4 thus arranged are connected to printed board 5, and shield film 6 is wound around printed board 5. Then, core 2 thus assembled is disposed in coil casing 7, and the primary filling with coil unit sealing epoxy resin 51 is performed for stabilizing coil characteristics. Then, code 10 is inserted through metal casing 8 and clamp portion 9, and a terminal of code 10 is connected to a predetermined portion of printed board 5. Then, coil casing 7 is put into base member 8. Transparent resin 42 already described is laid over the upper surface of display element 41 of printed board 5, and clamp portion 9 is located inside metal casing 8. Thereby, printed board 5 is inserted into guide grooves 37 and holding grooves 39. In this manner, the proximity sensor is completed. Thereby, display element 41 is in contact with light conducting portion 34 of clamp portion 9 through transparent resin 42.

The proximity sensor thus assembled is located in dies, and a vacuum condition is set. Thereby, air is externally extracted from the proximity sensor through the air discharge grooves formed of the spaces provided by linear projections 22a–22d and 21a–21d at coil casing 7, and the pressure in the proximity sensor lowers. In this state, hot filler resin is injected with a low pressure, e.g., between 5 atm and 20 atm through opening 43 at clamp portion 9. Thereby, the filler resin is first brought into contact with printed board 5, and then entirely fills the casing. In this process, the temperature of the dies is appropriately selected, whereby the proximity sensor can be completed in a short time. In the above process, air flows between linear projections 21a–21d and 22a–22d as indicated by arrows C in FIG. 3. The resin injected with a low pressure is brought into contact with linear projections 21a–21d, and stays in resin accumulation groove 26 shown in FIG. 5. Therefore, the filler does not leak from coil casing 7, and can be held within metal casing 8.

Figure 10:
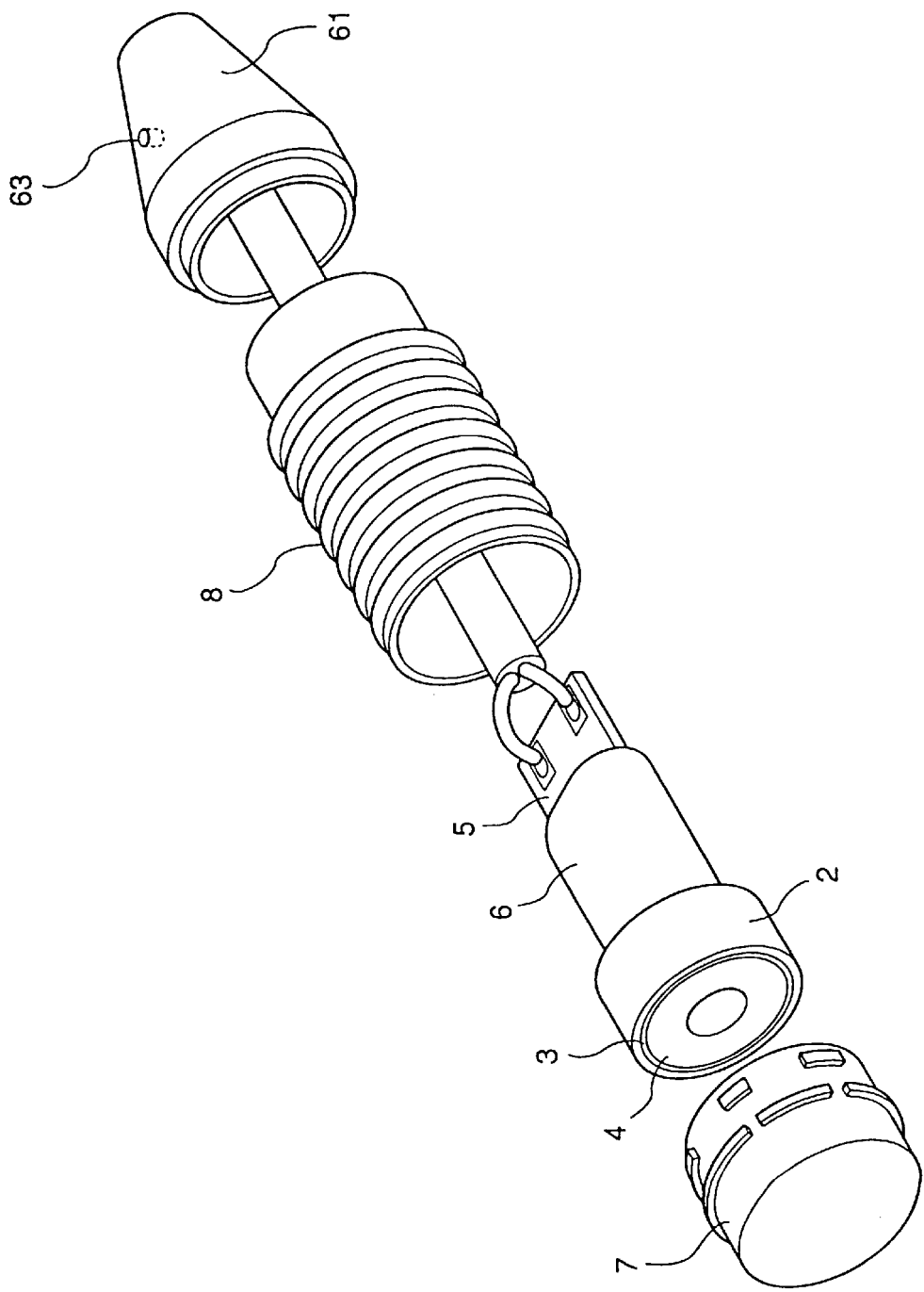
FIG. 10 shows a structure of a proximity sensor, before assembly, of a second embodiment of the invention.
Figure 11:
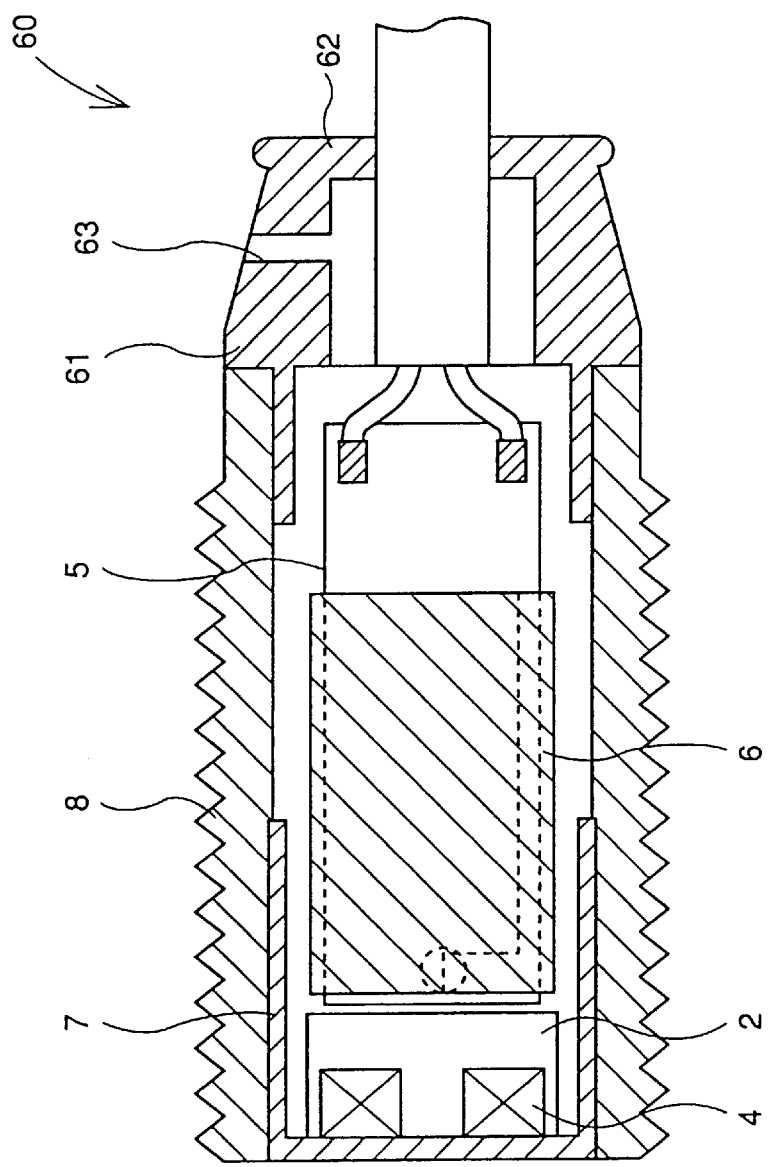
FIG. 11 is a cross section of the proximity sensor of the second embodiment.

A proximity sensor of a second embodiment of the invention will be described below. FIG. 10 shows a structure of a proximity sensor of the second embodiment before assembly, and FIG. 11 is a cross section of the same. As shown in these figures, a clamp portion 61 of this embodiment has a substantially conical form and is provided at its center with an opening as shown in FIG. 10. An end of clamp portion 61 near metal casing 8 has a reduced diameter equal to the inner diameter of metal casing 8. A code holding portion 62 of clamp portion 61 forming the rear end of the proximity sensor has a reduced inner diameter equal to the diameter of code 10. Clamp portion 61 is provided at its side wall with an opening 63. Structures other than the above are the same as those of the embodiment 1 already described.

Figure 12A:
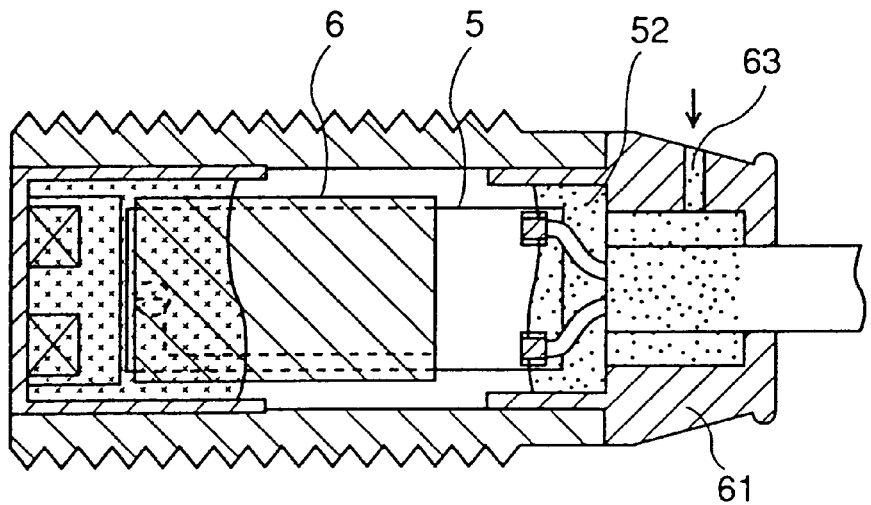
FIGS. 12a, 12b and 12c show states of resin in a process of filling the proximity sensor with the resin in the second embodiment.
Figure 12B:
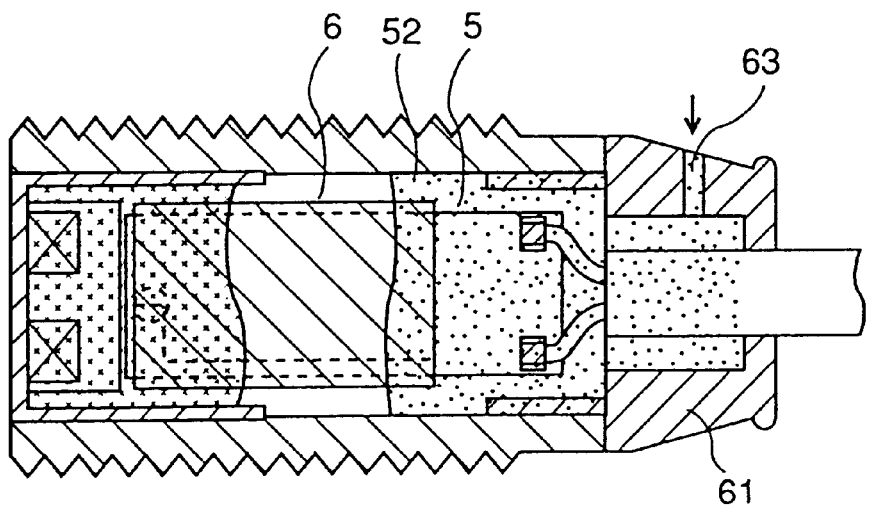
Figure 12C:
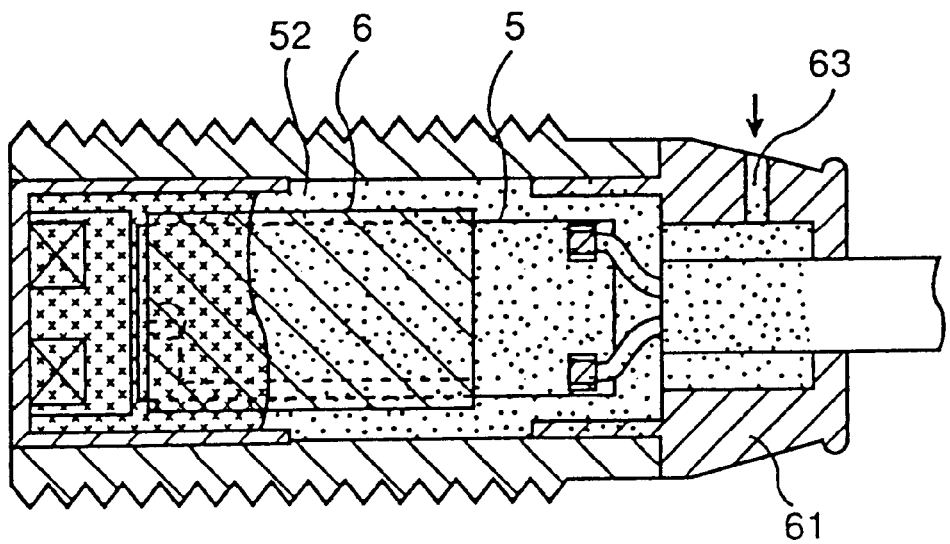

FIG. 12a shows various states during injection of filler resin 52 through opening 63 at clamp portion 61 in the second embodiment. As already described, the coil casing of proximity sensor 60 is filled with coil unit sealing resin represented by "X", and the proximity sensor in this state is held in dies with a vacuum pressure. Resin represented by "." is injected through opening 63 at clamp portion 61, so that air is discharged through the gap at coil casing 7. In accordance with this, filler resin 52 successively enters the proximity sensor, and it is filled with the resin as shown in FIGS. 12a, 12b and 12c. Since code holding portion 62 of clamp portion 61 has the inner diameter equal to code 10, resin does not leak through the gap around the code when filler resin 52 is supplied into the casing as described above.

Figure 13:
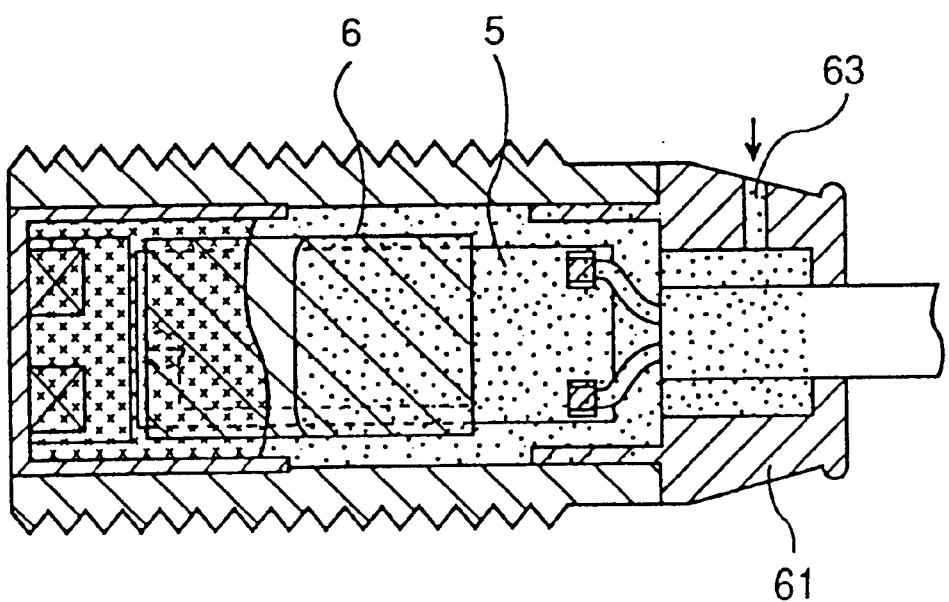
FIG. 13 shows a state in which the structure is not completely filled with the resin in the second embodiment.

A third embodiment of the invention will be described below. A proximity sensor of the third embodiment includes shield film 6 provided with an opening for allowing reliable injection of resin. If the proximity sensor had a small diameter and shield film 6 were not provided with an opening, air would not be completely discharged and would be left at a region between coil unit sealing resin and shield film 6 as shown in FIG. 13. In view of this, the opening is formed at shield film 6. Structures other than the above are the same as those of the second embodiment.

Figure 14:
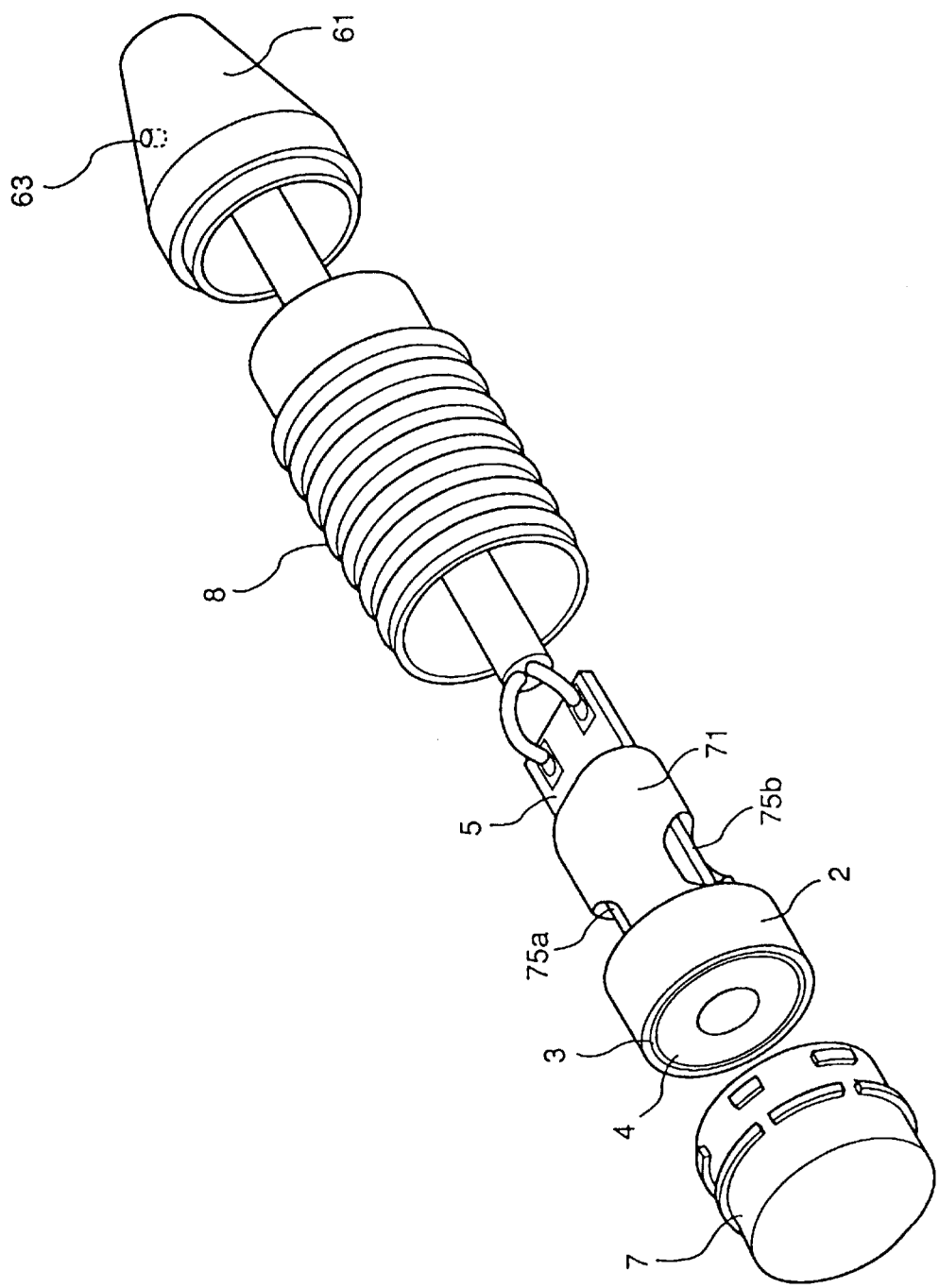
FIG. 14 shows a structure of a proximity sensor, before assembly, of a third embodiment of the invention.
Figure 15A:
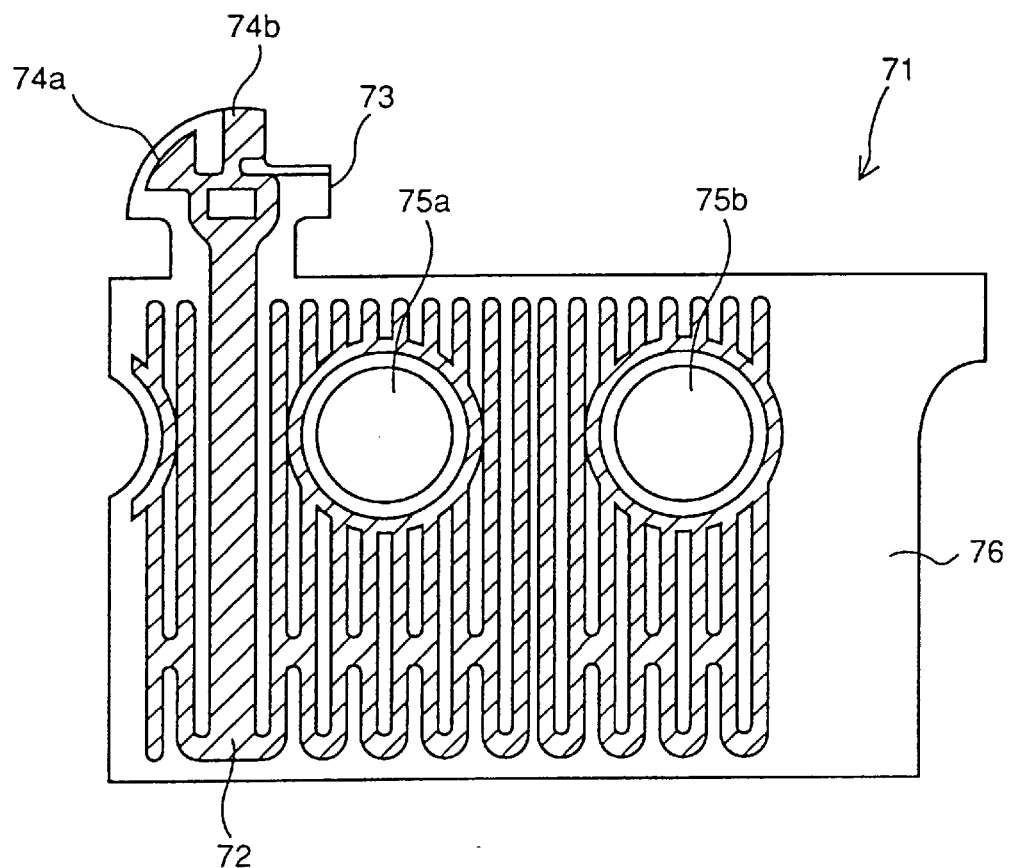
FIG. 15a is a development of a shield film in the third embodiment.
Figure 15B:
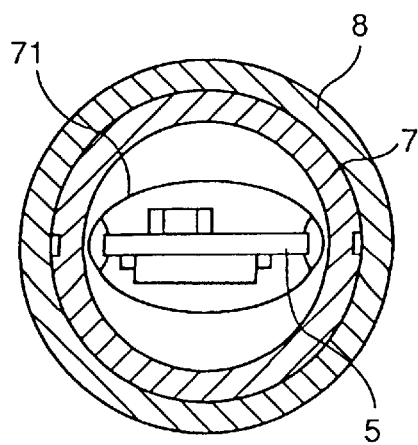
FIG. 15b is a cross section of the proximity sensor wrapped with the shield film of the third embodiment.

FIG. 14 shows a structure of a proximity sensor of a third embodiment before assembly. FIG. 15a is a development showing an example of a shield film 71 used in this proximity sensor. Shield film 71 is formed of a substantially rectangular flexible board, and a substantially comb-like pattern 72 is formed at one surface of film 71. Shield film 71 is provided at its one end with a projection 73, in which ends 74a and 74b of pattern 72 are formed. Two openings 75a and 75b are formed at a central portion of the conductor pattern of shield film 71. A double-side adhesive portion 76 is formed at a right end of the rectangular board. Shield film 71 is curved to wrap printed board 5 as shown in FIG. 15b so that one end thereof covers and adheres to double-side adhesive portion 76. In this wrapped state, a pair of openings 75a and 75b are located at positions corresponding to opposite ends of printed board 5. This can reduce an influence on the electronic circuitry on printed board 5.

Figure 16A:
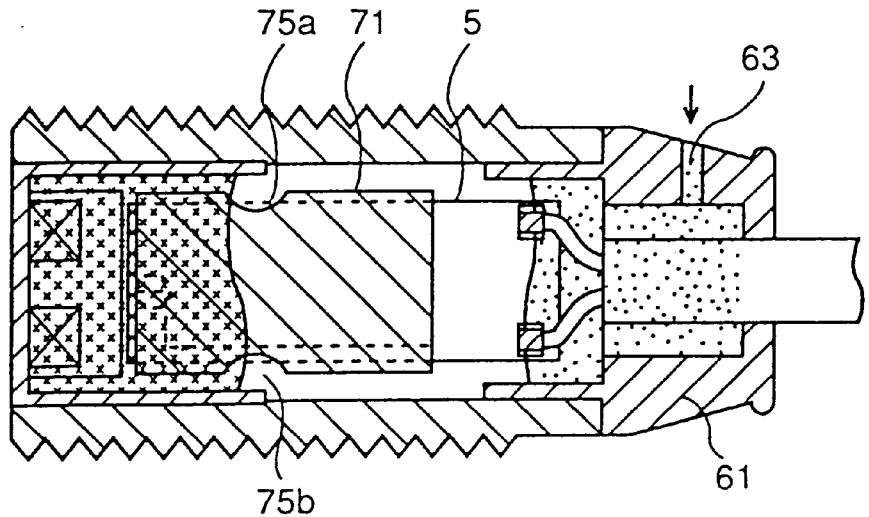
FIGS. 16a, 16b and 16c show states of resin in a process of filling the proximity sensor with the resin in the third embodiment.
Figure 16B:
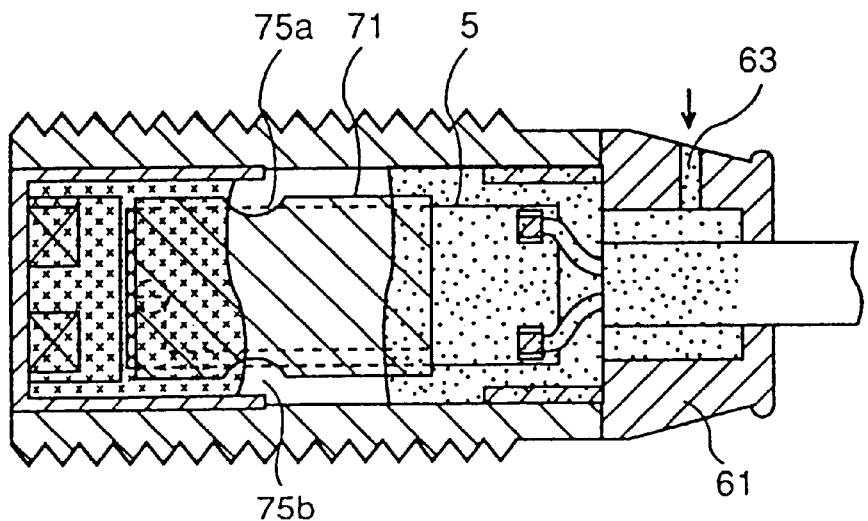
Figure 16C:
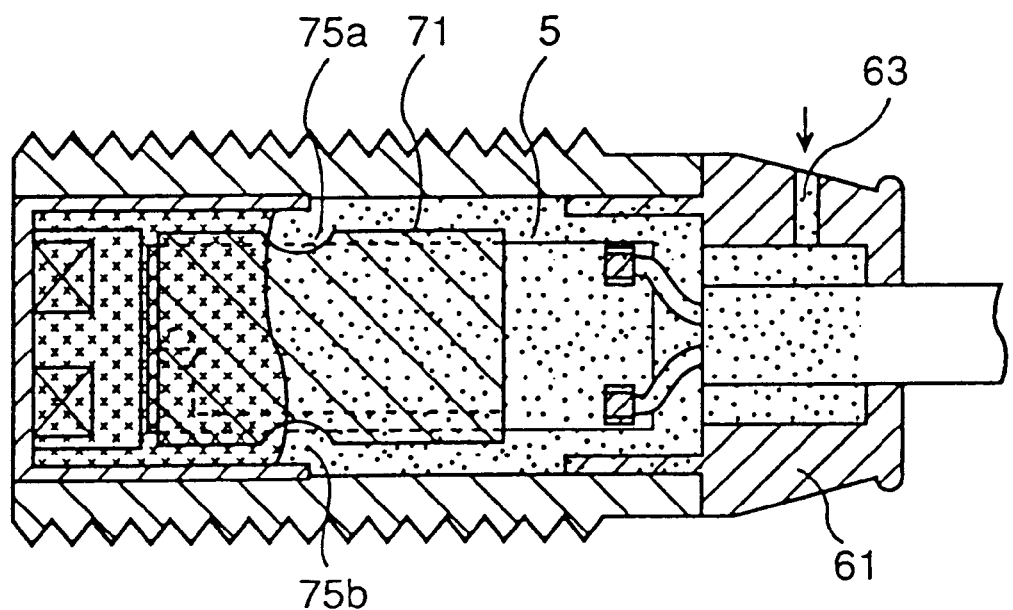

FIGS. 16a and 16b show states during supply of resin into the proximity sensor thus constructed of the third embodiment. When resin is supplied through opening 63 into the proximity sensor maintained under vacuum, a portion near clamp portion 61 is first filled with resin which will successively expand therefrom to a portion filled with coil unit sealing resin 51 as shown in FIGS. 16b and 16c. Since through-apertures 75a and 75b are formed at shield film 71, no air remains between shield film 71 and printed board 5, and a gap is filled with resin in the above process. This improves an environmental resistance of the proximity sensor. Further, the filling operation can be performed extremely easily and reliably in a short time, as can be done in the first embodiment.

Although the shield film has the two openings in the third embodiment described above, a similar effect can be achieved by at least one opening.

In the operation of filling the proximity sensor with the resin according to the embodiment described above, the resin is supplied into the proximity sensor maintained at a low pressure through the opening with a low pressure, so that the casing can be reliably filled with resin. In this case, the resin is hardened in a short time, so that the steps can be reduced in number, and the manufacturing time can be significantly reduced. Owing to provision of the opening at the shield film covering the printed board, the resin can be filled reliably.

A fourth embodiment of the invention will be described below. In the following description, a difference between the first and fourth embodiments will mainly be discussed. Except for portions which will be described below, the proximity sensor of the fourth embodiment is the same as that of the first embodiment. Accordingly, the same portions as those in the first embodiment will not be described below.

Figure 17:
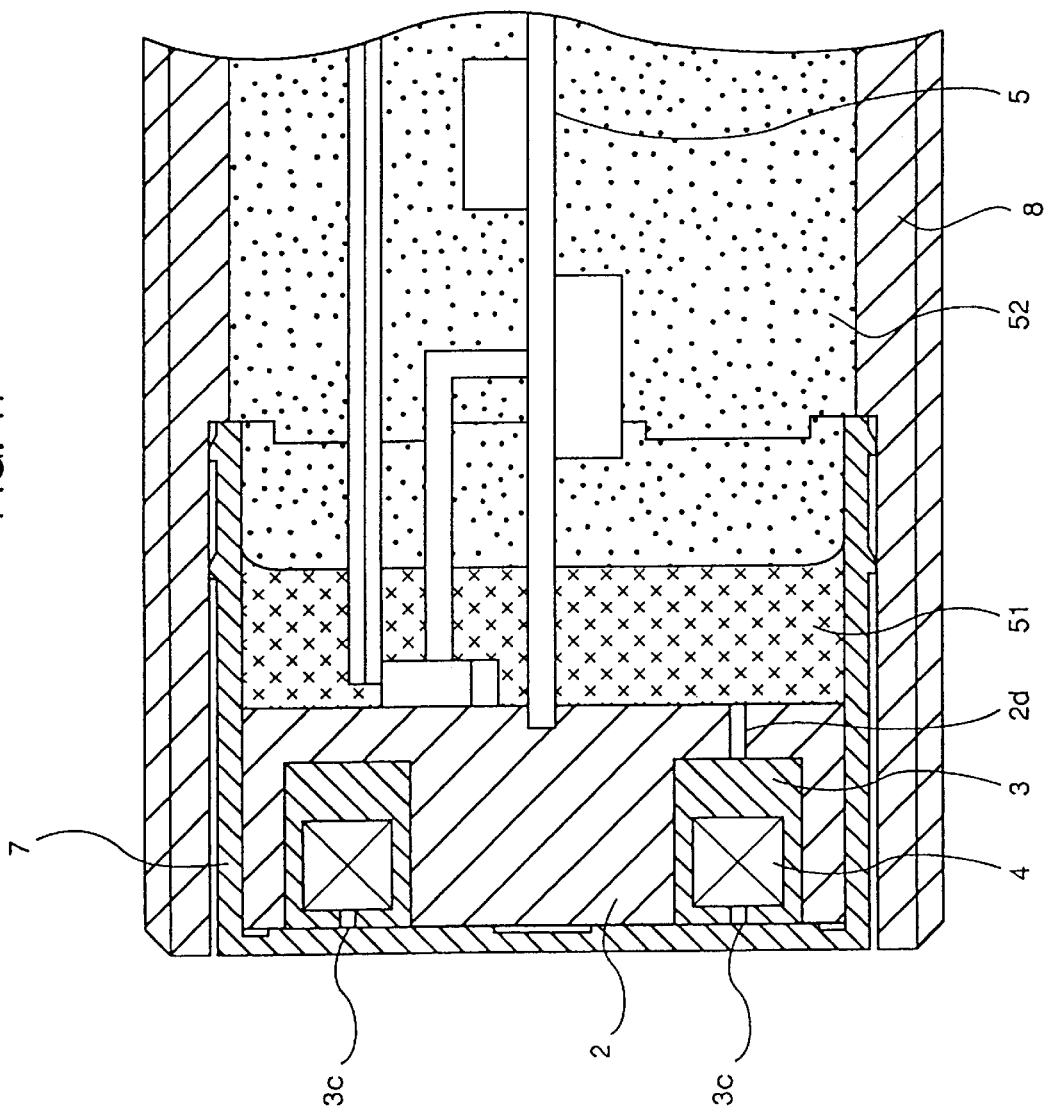
FIG. 17 is a cross section showing, on an enlarged scale, a tip end of a proximity sensor of a fourth embodiment.

FIG. 17 shows, on an enlarged scale, a tip end of the proximity sensor of the fourth embodiment. Coil spool 3 is provided at its front surface with a plurality of through-apertures 3c. Through-apertures 3c function as will be described later. A plurality of through-apertures 2d are at core 2. Through-apertures 2d function as will be described later.

Figure 18B:
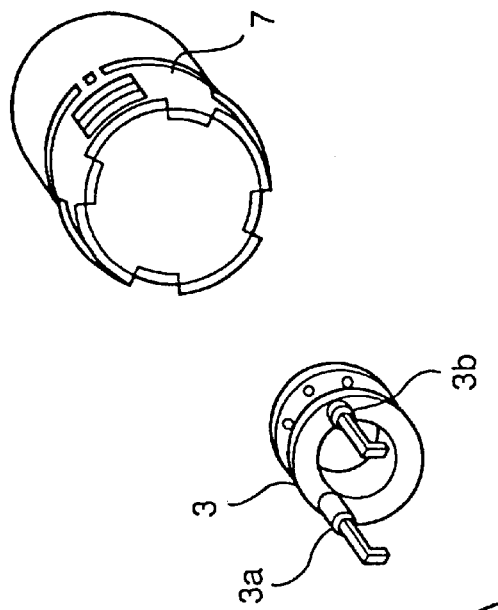
FIG. 18b shows an assembly of the core and the coil to be accommodated in the coil casing in the fourth embodiment before assembly.
Figure 18A:
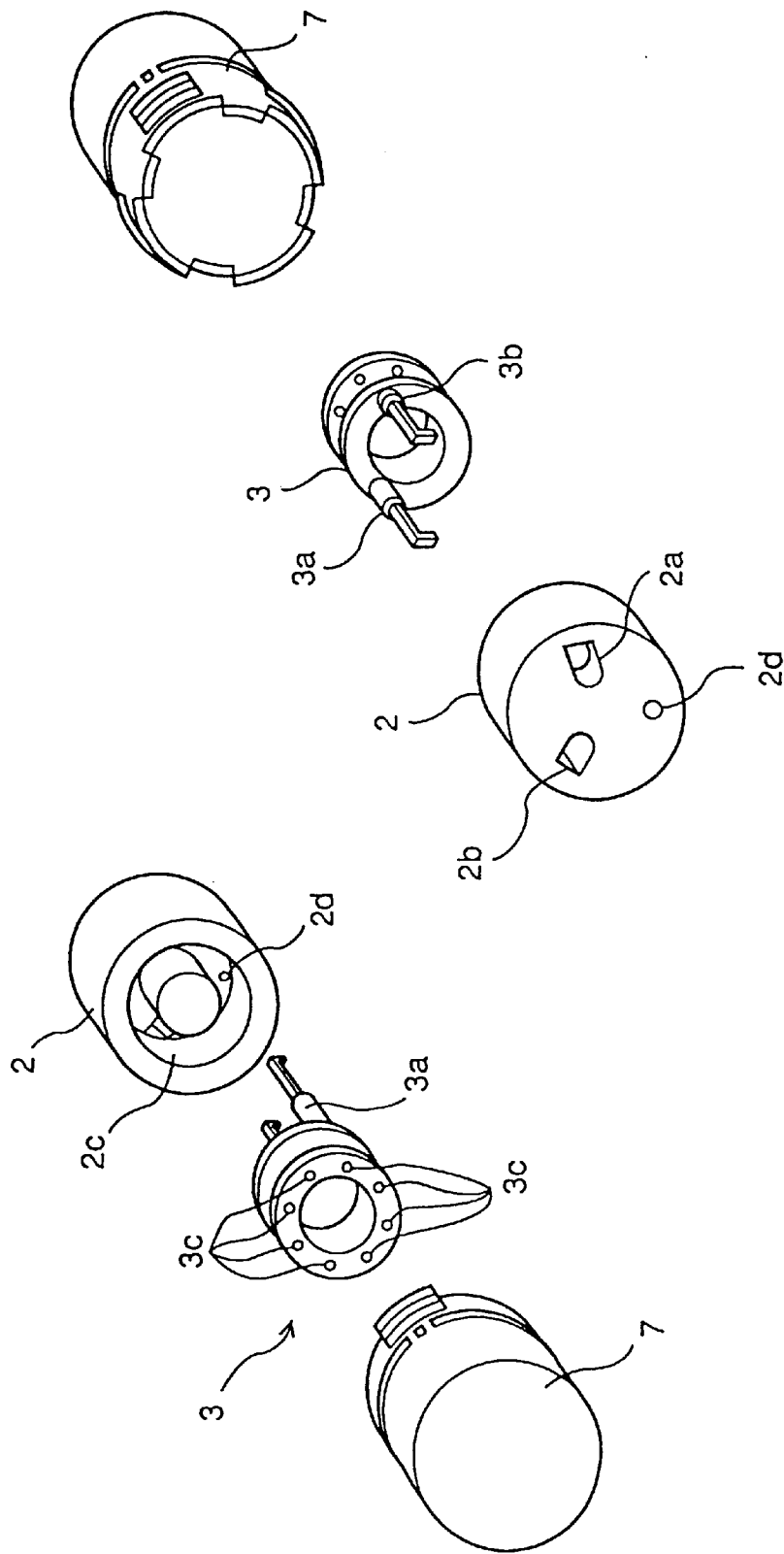
FIG. 18a shows a core and a coil to be accommodated in a coil casing of the fourth embodiment before assembly.
Figure 20C:
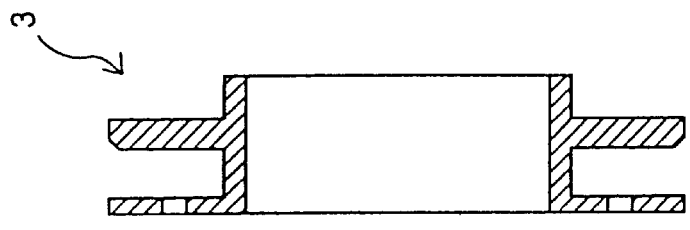
FIG. 20c is a cross section of the coil spool in the fourth embodiment.
Figure 20B:
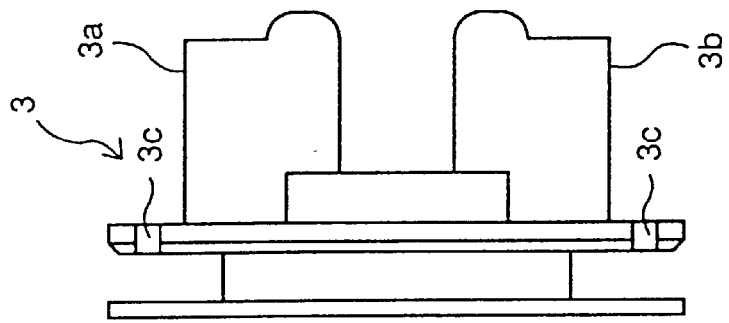
FIG. 20b is a side view of the coil spool in the fourth embodiment.
Figure 20A:
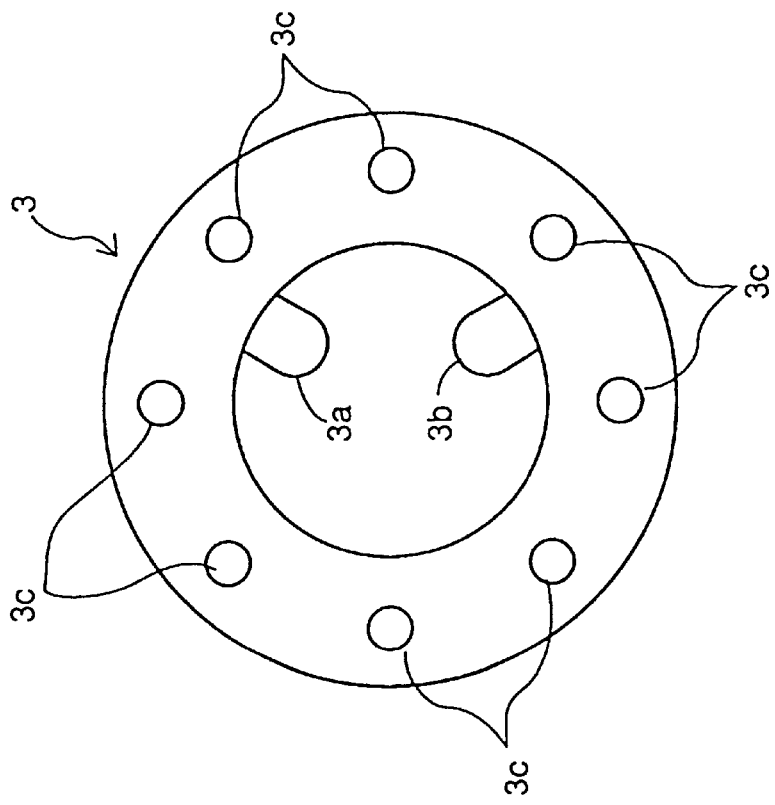
FIG. 20a is an elevation of a coil spool in the fourth embodiment.

Core 2 and coil spool 3 accommodated in coil casing 7 will be described below. FIG. 18a shows core 2 to be accommodated in coil casing 7 and coil 4 wound around coil spool 3 before assembly. FIG. 18b shows the same structure view at a reverse angle. FIG. 19a is an elevation of core 2, and FIG. 19b is a cross section. As shown in these figures, core 2 has an annular groove 2c, and also has two substantially flat-D-shaped through-apertures 2a and 2b as well as a circular through-aperture 2d, which are circumferentially spaced by 120° from each other around the center of annular groove 2c. As can be seen from an elevation of FIG. 20a, a side view of FIG. 20b and a cross section of FIG. 20c, coil spool 3 has a spool portion around which the coil is wound, and also has terminals 3a and 3b for guiding and holding the opposite ends of coil. As shown in the elevation of FIG. 20a, a plurality of through-apertures 3c are formed at the spool portion. Coil 4 is wound around the spool portion, and has opposite ends which are held by terminals 3a and 3b and are externally led through through-apertures 2a and 2b at core 2 for connection to the oscillator circuit on printed board 5.

A process of manufacturing the proximity sensor of this embodiment will be described below. Coil 4 wound around coil spool 3 is located in the annular groove at core 2. The leads at the opposite ends of coil 4 are connected to printed board 5, and shield film 6 is wound around printed board 5. Core 2 thus assembled is put into coil casing 7, and primary filling with coil unit sealing epoxy resin 51 is performed for stabilizing the coil characteristics. Although coil unit sealing resin 51 for the primary filling has a high viscosity, no air remains around the coil owing to the following structure. Since coil spool 3 is provided with through-aperture 3c, and core 2 is also provided with through-apertures 2a, 2b and 2c. In addition to this, coil casing 7 is provided at its inner surface with the projections already described. Therefore, the resin primarily supplied into coil casing 7 can fully fill the casing, and thus no air remains around the coil. Then, code 10 is inserted through metal casing 8 and clamp portion 9, and the terminal of code 10 is connected to a predetermined portion of printed board 5. Then, coil casing 7 is put into metal casing 8. Clamp portion 9 is fitted into metal casing 8. In this manner, the proximity sensor is assembled.

The proximity sensor thus assembled is disposed in dies and a vacuum state is attained. Thereby, air is externally extracted from the proximity sensor through the air discharge grooves formed of gaps between linear projections 22a–22d and 21a–21d at coil casing 7, so that the pressure in the proximity sensor lowers. In this state, hot filler resin is injected through opening 9a at clamp portion 9 with a low pressure, e.g., between 5 atm and 20 atm. The resin thus supplied is brought into contact with printed board 5, and further flows in the casing to fill entirely the casing. In this process, the temperature of dies is appropriately selected, whereby the proximity sensor can be completed in a short time. In the above process, air flows between linear projections 21a–21d and 22a–22d as indicated by arrows C in FIG. 3. The resin injected with a low pressure is brought into contact with linear projections 21a–21d, and stays in resin accumulation groove 26 shown in FIG. 5. Therefore, the filler does not leak from coil casing 7, and can be held within metal casing 8.

Although the fourth embodiment has been described in connection with the proximity sensor, the invention can be applied to various electronic components other than the proximity sensor such as a data carrier in an ID unit having such a structure that a coil is held in a cylindrical casing, a space around the coil is filled with primary filler resin, and an integral structure is subsequently formed in the casing.

According to the fourth embodiment described above, the space around the coil can be reliably filled with the primary filler resin. Therefore, no air remains, so that expansion of the coil casing can be prevented, and thus the coil characteristics can be stable.

Figure 21:
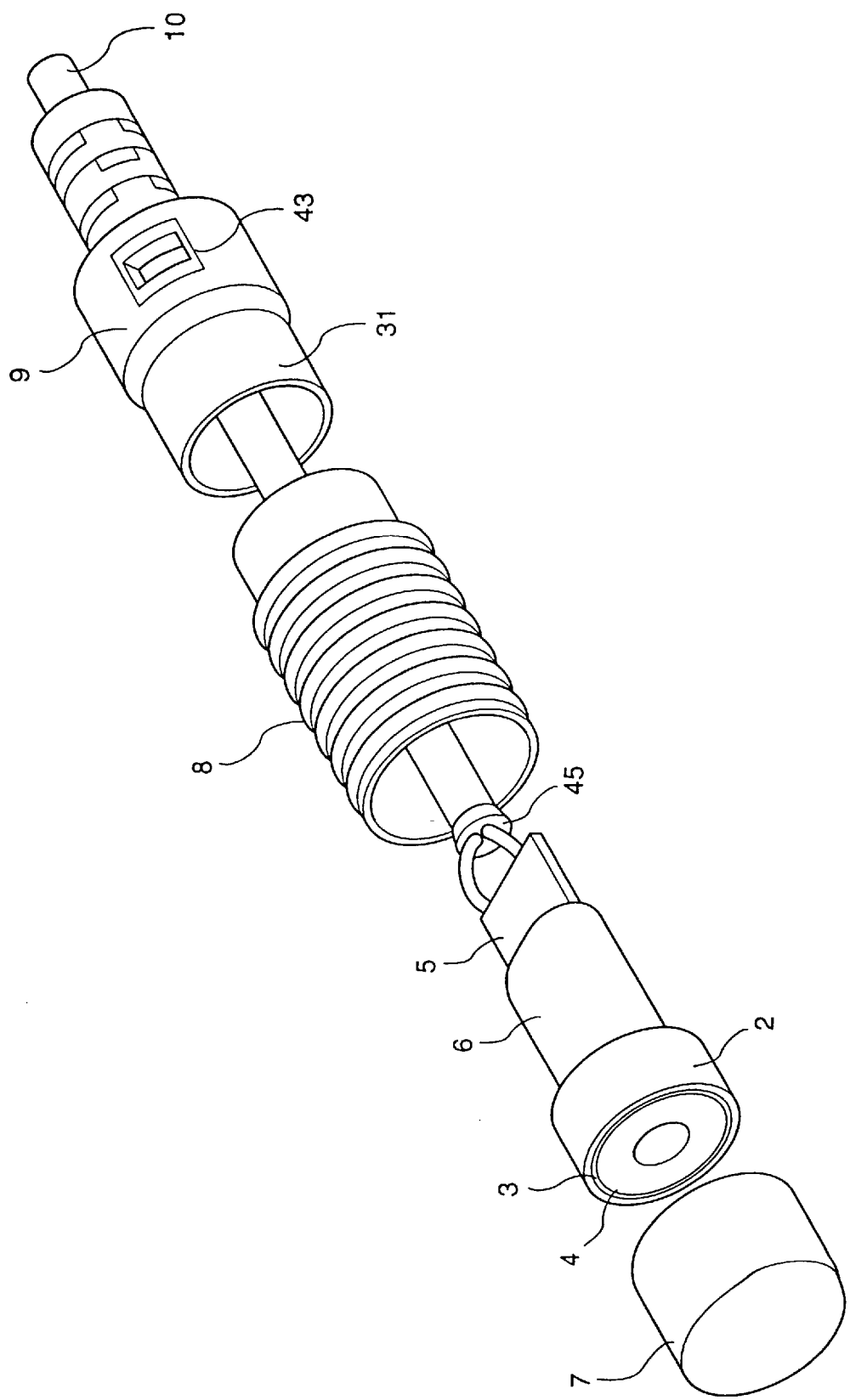
FIG. 21 shows a structure of a proximity sensor, before assembly, of a fifth embodiment.
Figure 22:
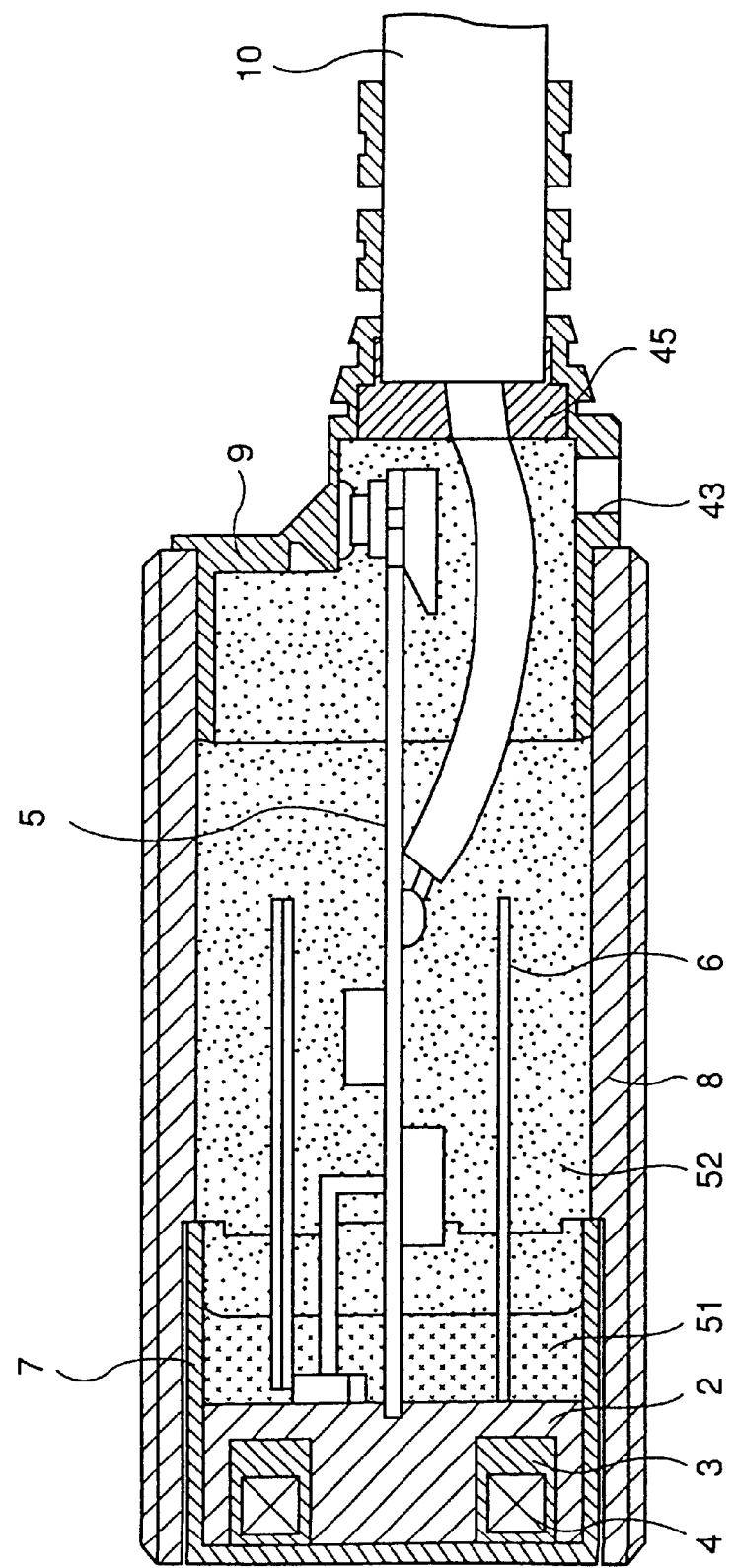
FIG. 22 is a cross section of the proximity sensor of the fifth embodiment.

The proximity sensor of a fifth embodiment of the invention will be described below. FIG. 21 shows a structure of a proximity sensor, before assembly, of the fifth embodiment. FIG. 22 is a cross section of the proximity sensor of the fifth embodiment. In the following description, only a difference between the first and fifth embodiments will mainly be discussed.

The proximity sensor of the fifth embodiment differs from that of the first embodiment in the following points. Coil casing 7 is not provided at its outer periphery with linear projections 21a–21d. Further, a ring code 45 is provided at an end of code 10 near the printed board. Ring code 45 is employed for filling a space between clamp portion 9 and code 10. Metal casing 8 and coil casing 7 have sections of different forms. More specifically, metal casing 8 has an elliptic section, and coil casing 7 has a completely circular section. Since metal casing 8 and coil casing 7 have different sectional forms, gaps forming an air discharge passage is formed between the inner peripheral surface of metal casing 8 and the outer peripheral surface of coil casing 7. Metal casing 8 is provided at its inner peripheral surface with a plurality of recesses (not shown), through which the air discharge passage is communicated with the interior of metal casing 8.

Owing to the above structure, air is externally extracted through the air discharge passage in the process of injecting filler resin 52. In contrast to the foregoing case, metal casing 8 may have a completely circular section, and coil casing 7 may have an elliptic section. Thus, any relationship may be present between the sectional forms of metal casing 8 and coil casing 7 provided that an air discharge passage, which allows passage of air but suppresses passage of resin, is formed between the inner peripheral surface of metal casing 8 and the outer peripheral surface of coil casing 7. The gap or space forming the air discharge passage is preferably in a range from 0.1 mm to 0.01 mm.

According to this fifth embodiment, the resin filling operation can be performed extremely easily and reliably in a short time, as can be done also in the first embodiment.

Figure 23:
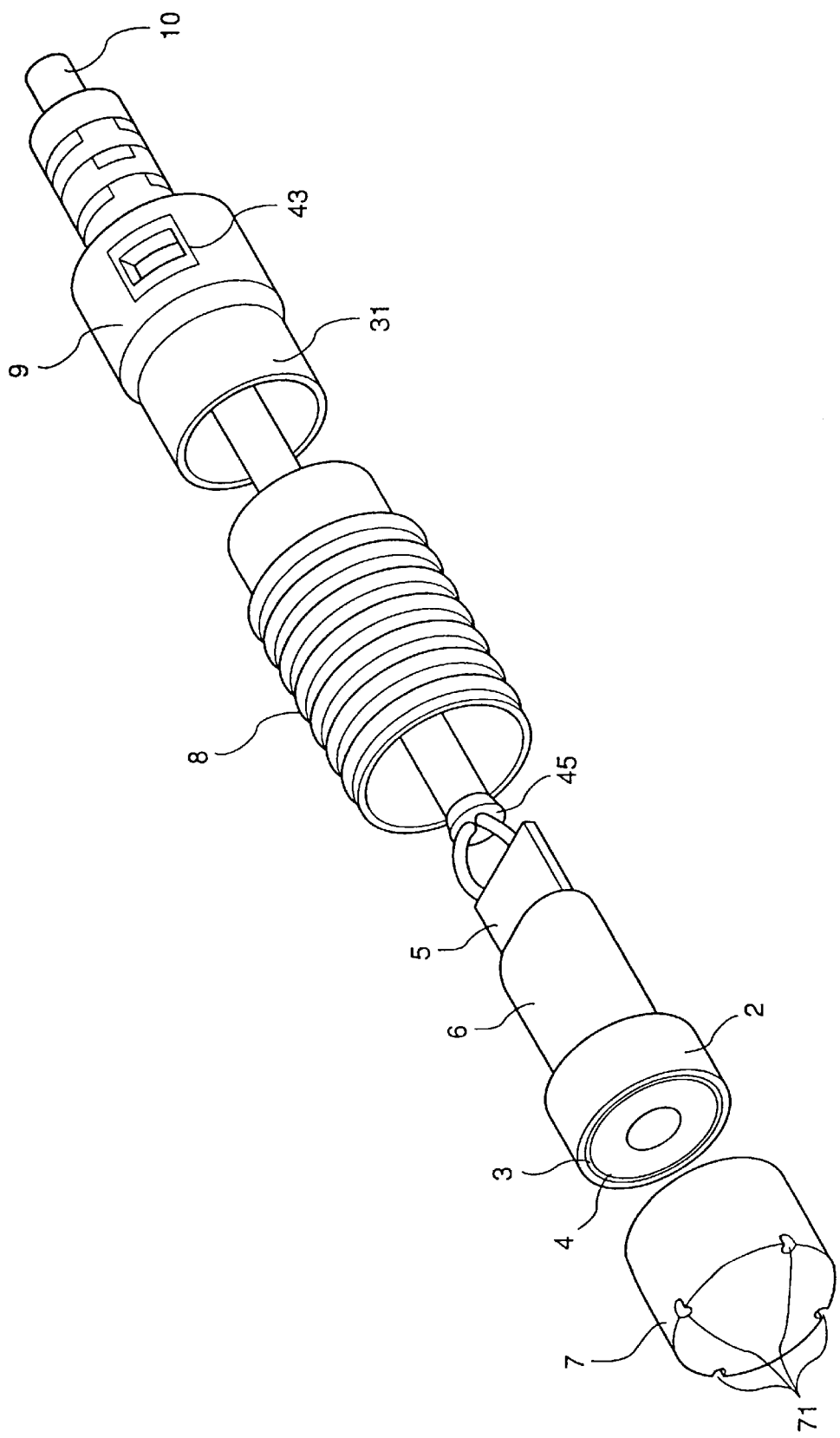
FIG. 23 shows a structure of a proximity sensor, before assembly, of a sixth embodiment.
Figure 24:
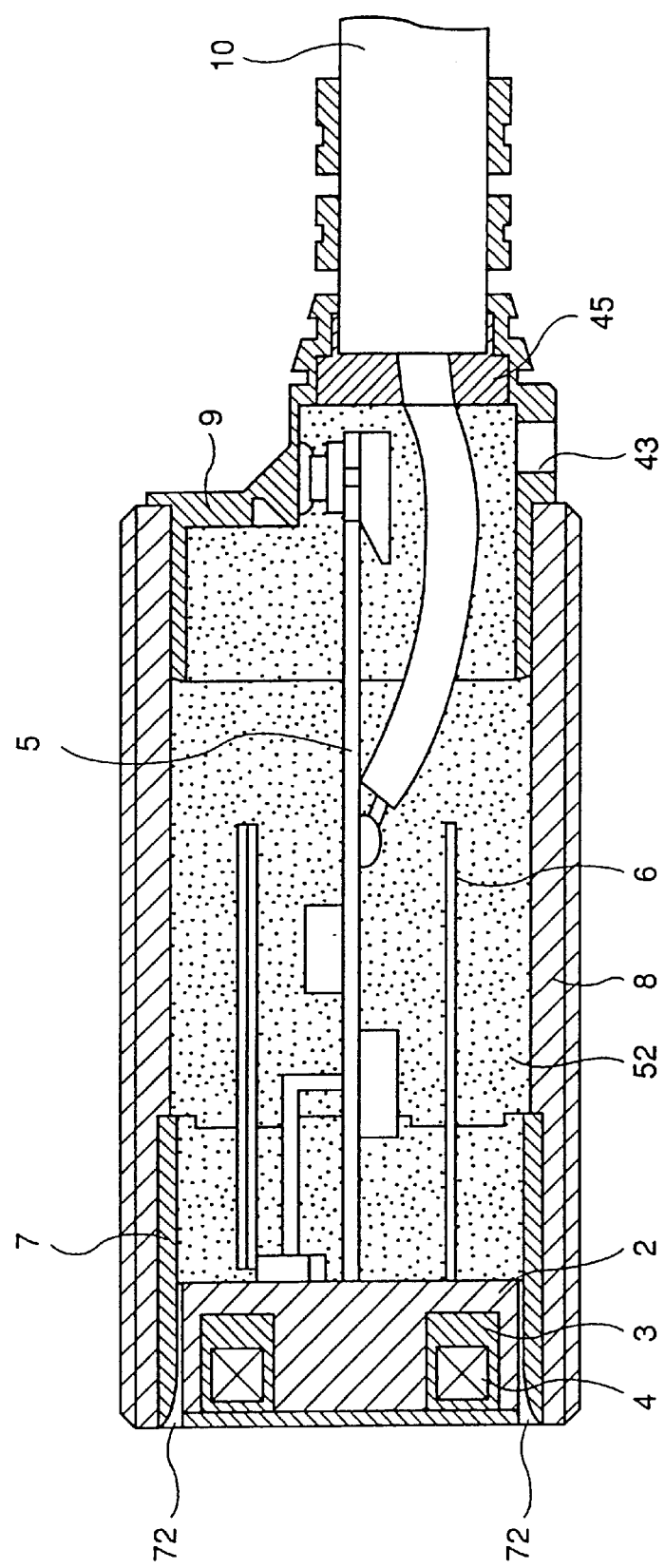
FIG. 24 is a cross section of the proximity sensor of the sixth embodiment.

A proximity sensor of a sixth embodiment of the invention will be described below. FIG. 23 shows a structure of the proximity sensor before assembly of the sixth embodiment. FIG. 24 is a cross section of the proximity sensor of the sixth embodiment. In the following description, the proximity sensor of the sixth embodiment will be discussed only in connection with a difference from that of the first embodiment.

The proximity sensor of the sixth embodiment differs from that of the first embodiment in the following points. Coil casing 7 is not provided at its periphery with linear projections 21a–21d. Ring code 45 is formed at an end of code 10 near printed board 5.

Further, a plurality of through-apertures 71 are formed at the periphery of the end surface of coil casing 7. The interior and exterior of coil casing 7 are communicated with each other by through-apertures 71. The outer diameter of core 2 is smaller by a predetermined value than an inner diameter of metal casing 8. This predetermined value is very small. Therefore, a gap is formed between the inner peripheral surface of metal casing 8 and the outer peripheral surface of coil casing 7. This gap may be defined by an irregular surface which has many concavities and convexities and is formed by a powder of magnetic material coating the outer peripheral surface of core 2. The gap thus formed and through-apertures 71 form an air discharge passage. The air discharge passage communicates the exterior and interior of coil casing 7 and metal casing 8 with each other.

The structure is not filled with coil unit sealing resin 51. Core 2 is fitted into casing 7, whereby core 2 is fixed. An interior of the assembly of core 2, coil casing 7 and metal casing 8 is entirely filled with filler resin 52. Owing to this structure, air can be externally extracted through the air discharge passage in the process of filling the structure with filler resin 52.

According to the above sixth embodiment, the resin filling operation can be performed extremely easily and reliably in a short time, as can be done in the first embodiment.

Figure 25:
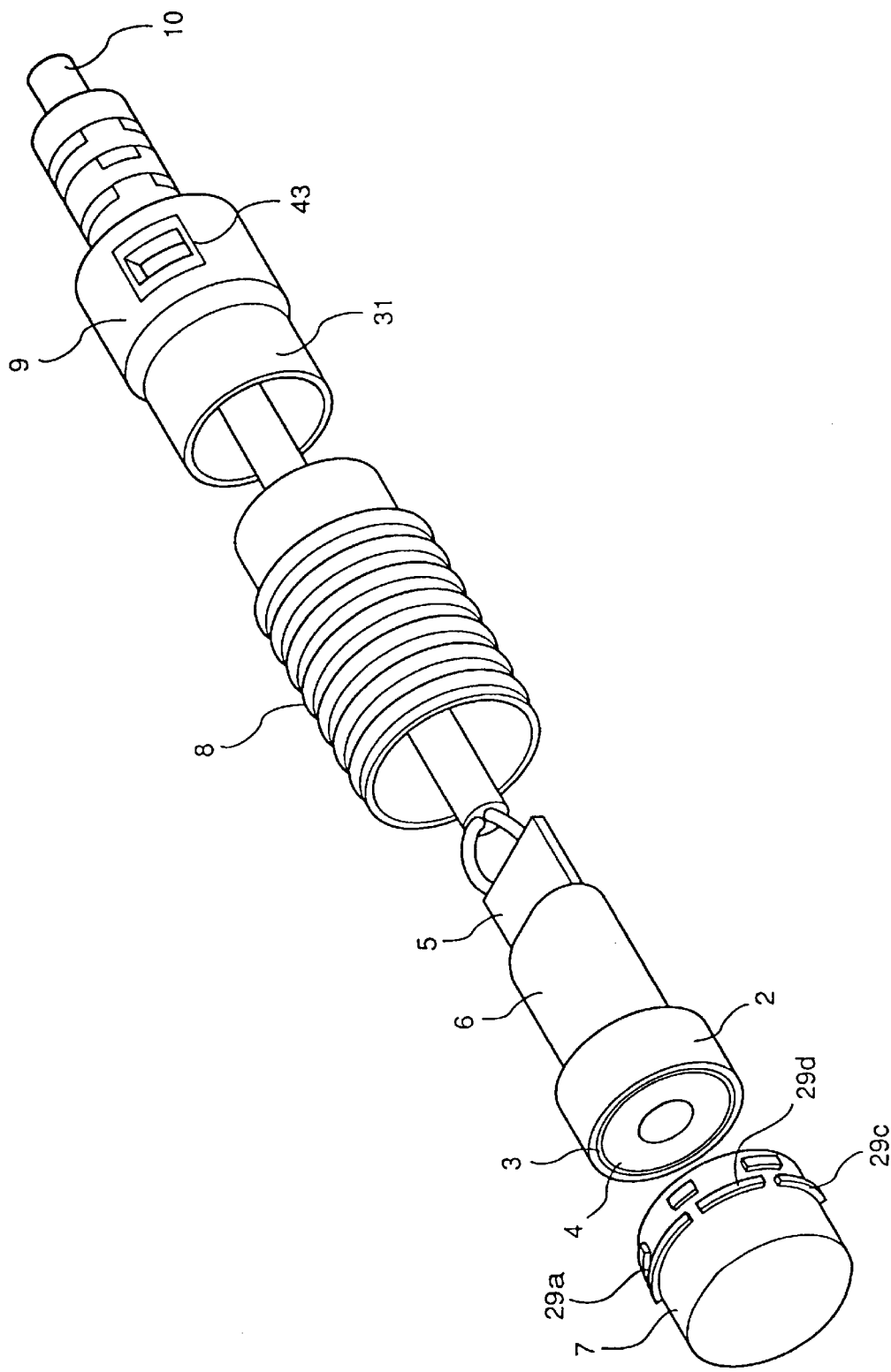
FIG. 25 shows a structure of a proximity sensor, before assembly, of a seventh embodiment.
Figure 26:
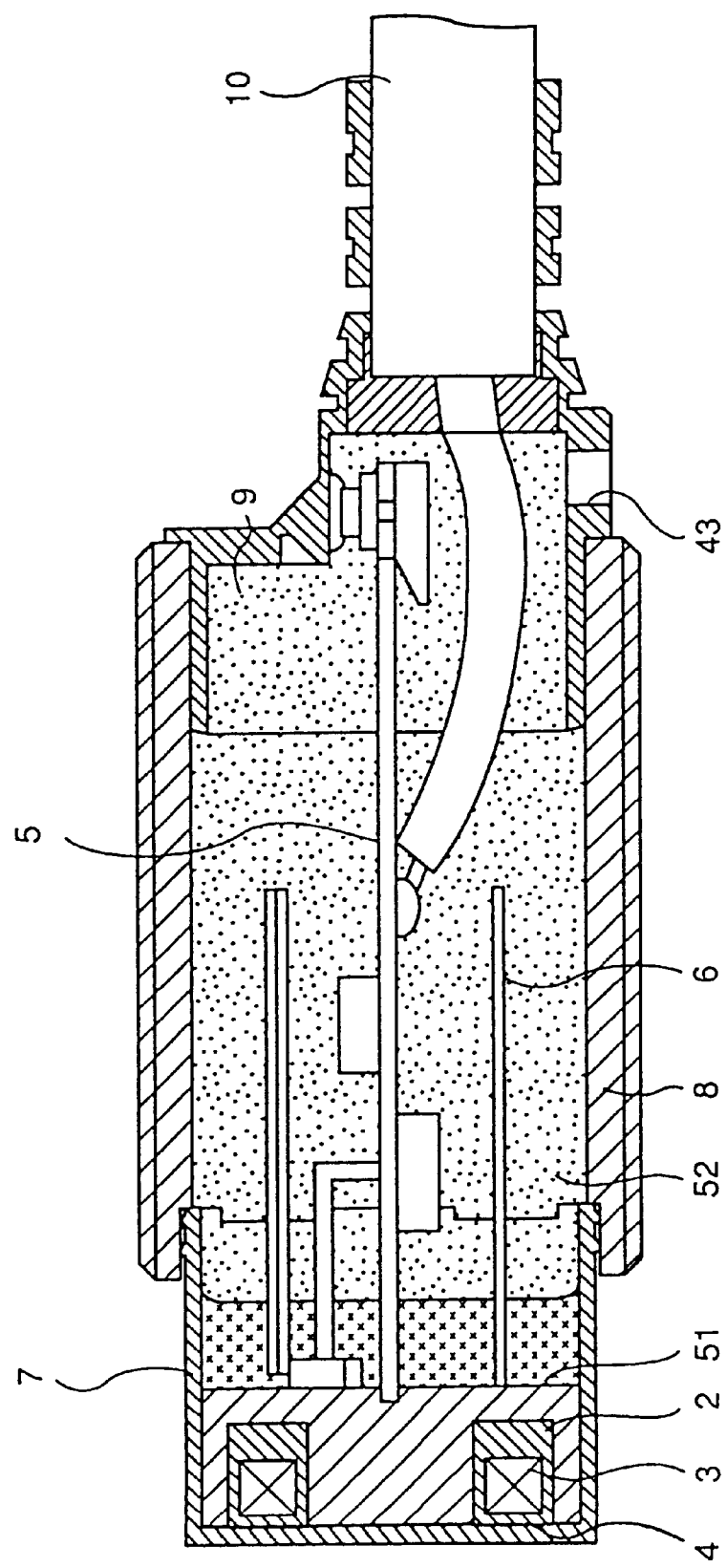
FIG. 26 is a cross section of the proximity sensor of the seventh embodiment.

A proximity sensor of a seventh embodiment of the invention will be described below. The proximity sensor of the seventh embodiment is of a so-called non-shield type, in which coil casing 7 is exposed outside metal casing 8. FIG. 25 shows a structure of the proximity sensor before assembly of the seventh embodiment. FIG. 26 is a cross section of the proximity sensor of the seventh embodiment. In the following description, the proximity sensor of the seventh embodiment will be discussed mainly in connection with a difference from the first embodiment.

The proximity sensor of the seventh embodiment differs from the first embodiment in the following points. Coil casing 7 is provided at its outer periphery with linear projections 29a–29d, which are located at positions between positions of linear projections 21a–21d in the first embodiment and positions of linear projections 22a–22d. Further, only one end portion of coil casing 7, at which linear projections 29a–29d and linear projections 22a–22d are formed, is fitted into metal casing 8. Therefore, an air discharge passage is formed between the outer peripheral surface of coil casing 7 and the inner peripheral surface of metal casing 8 owing to provision of linear projections 29a–29d and 22a–22d. This air discharge passage forms a communication passage between the interior and exterior of metal casing 8. Owing to the foregoing structure, air is externally extracted through the air discharge passage in the process of supplying filler resin 52.

According to this seventh embodiment, the resin filling operation can be performed extremely easily and reliably in a short time, as can be done in the first embodiment.

Figure 27:
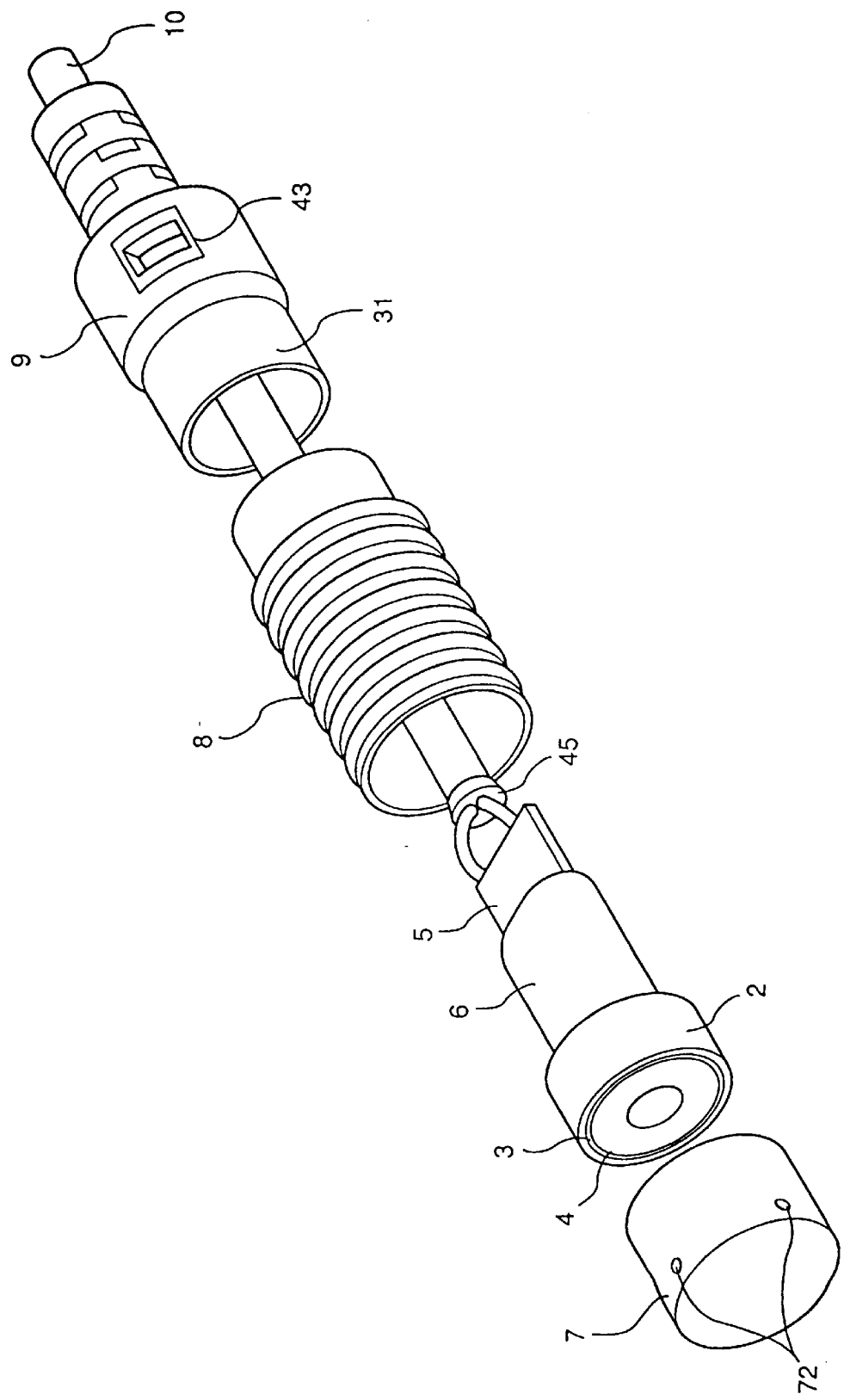
FIG. 27 shows a structure of a proximity sensor, before assembly, of an eighth embodiment.
Figure 28:
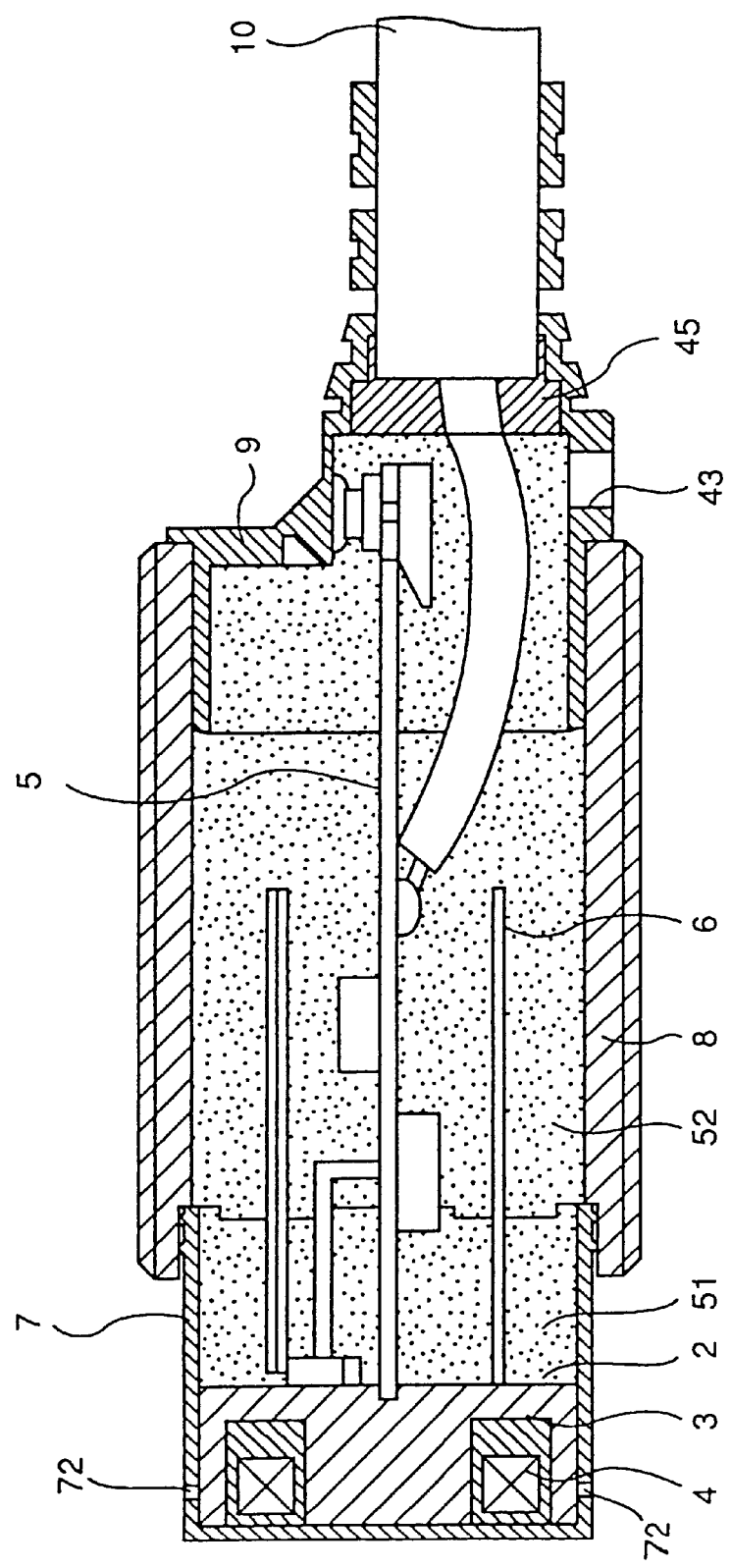
FIG. 28 is a cross section of the proximity sensor of the eighth embodiment.

A proximity sensor of an eighth embodiment will be described below. The proximity sensor of the eighth embodiment is of a so-called non-shield type in which coil casing 7 is exposed outside metal casing 8, and is not filled with coil unit sealing resin 51. FIG. 27 shows a structure of the proximity sensor of the eighth embodiment before assembly. FIG. 28 is a cross section of the proximity sensor of the eighth embodiment. In the following description, the proximity sensor of the eighth embodiment will be described mainly in connection with a difference from the first embodiment.

The proximity sensor of the eighth embodiment differs from the first embodiment in the following points. Coil casing 7 is not provided at its outer periphery with linear projections 21a–21d. Ring code 45 is formed at an end of code 10 near printed board 5. A plurality of air apertures 72 are formed at an outer periphery of an end of coil casing 7. An air discharge passage is formed of air apertures 72 and a gap defined between the outer peripheral surface of core 2 and the inner peripheral surface of coil casing 7. This air discharge passage forms a communication passage between the exterior and the interior of metal casing 8. Owing to the foregoing structure, air is externally extracted through the air discharge passage in the process of supplying filler resin 52.

According to the eighth embodiment, the resin filling operation can be performed extremely easily and reliably in a short time, as can be done in the first embodiment.

Figure 29:
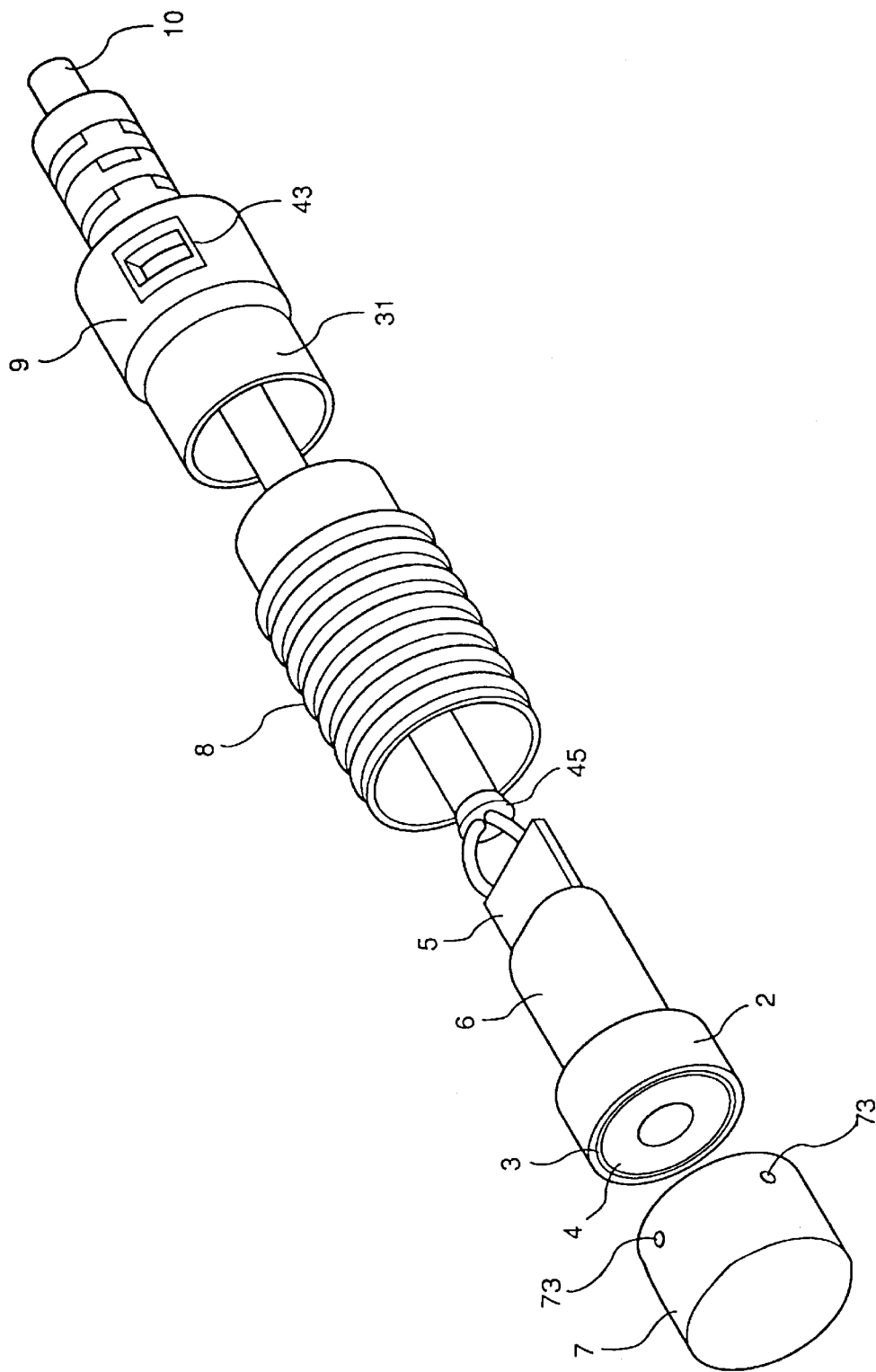
FIG. 29 shows a structure of a proximity sensor, before assembly, of a ninth embodiment.
Figure 30:
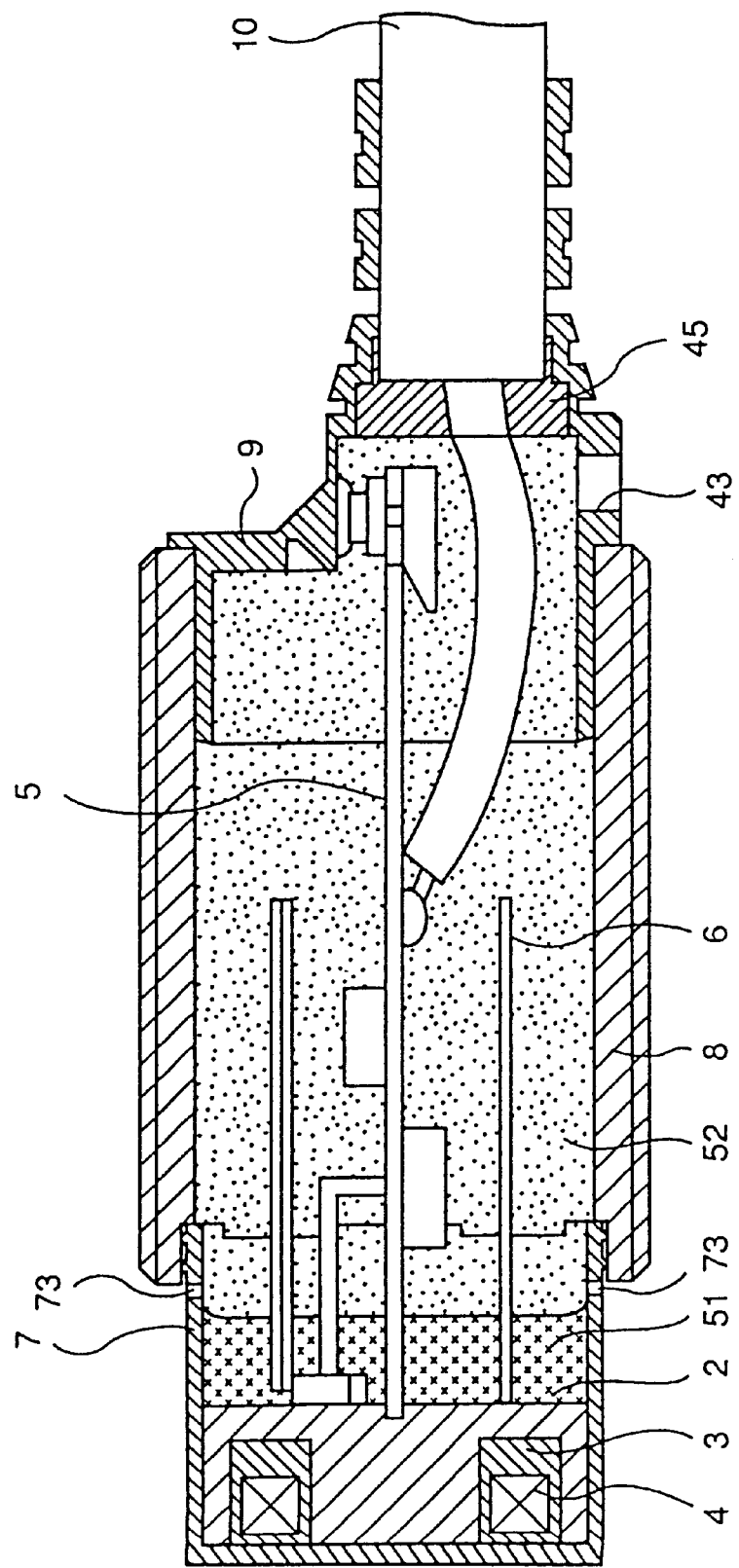
FIG. 30 is a cross section of the proximity sensor of the ninth embodiment.

A proximity sensor of a ninth embodiment will be described below. The proximity sensor of the ninth embodiment is of a so-called non-shield type in which the structure is filled with coil unit sealing resin 51. FIG. 29 shows a structure of the proximity sensor before assembly of the ninth embodiment. FIG. 30 is a cross section of the proximity sensor of the ninth embodiment. In the following description, the proximity sensor of the ninth embodiment will be described mainly in connection with a difference from the eighth embodiment.

The proximity sensor of the ninth embodiment differs from the eighth embodiment in the following points. Coil casing 7 is not provided with air apertures 72, but is provided at its outer peripheral portion near its opening with a plurality of air apertures 73. Air apertures 73 are formed at such positions that are not covered with metal casing 8 when coil casing 7 is fitted into metal casing 8. Therefore, the exterior and interior of coil casing 7 are communicated with each other through air apertures 73. Air apertures 73 form an air discharge passage. Owing to the foregoing structure, air is externally extracted through the air discharge passage, i.e., air apertures 73 in the process of supplying filler resin 52.

Description will now be given on a method of manufacturing metal casing 8 of the ninth embodiment. Core 2, to which coil 4, printed board 5 and shield film 6 are attached, is disposed in coil casing 7, and the assembly is filled with coil unit sealing resin 51. In this filling operation, an amount of coil unit sealing resin 51 is controlled to prevent closing of air apertures 73 at coil casing 7 by coil unit sealing resin 51. Coil casing 7 is forcedly fitted into metal casing 8. This operation is performed in such a manner that metal casing 8 does not close air apertures 73 at coil casing 7. Air in coil casing 7 and metal casing 8 is externally extracted through air apertures 73. Thereafter, filler resin 52 is supplied through resin inlet 43. Air aperture 73 has a size which allows passage of air but prevents passage of resin. If an air aperture 73 of a size allowing passage of resin is employed for any reason, an apparatus for manufacturing the proximity sensor employs a countermeasure for preventing leakage of resin.

According to the ninth embodiment, the resin filling operation can be performed extremely easily and reliably in a short time, as can be done in the first embodiment.

Figure 31:
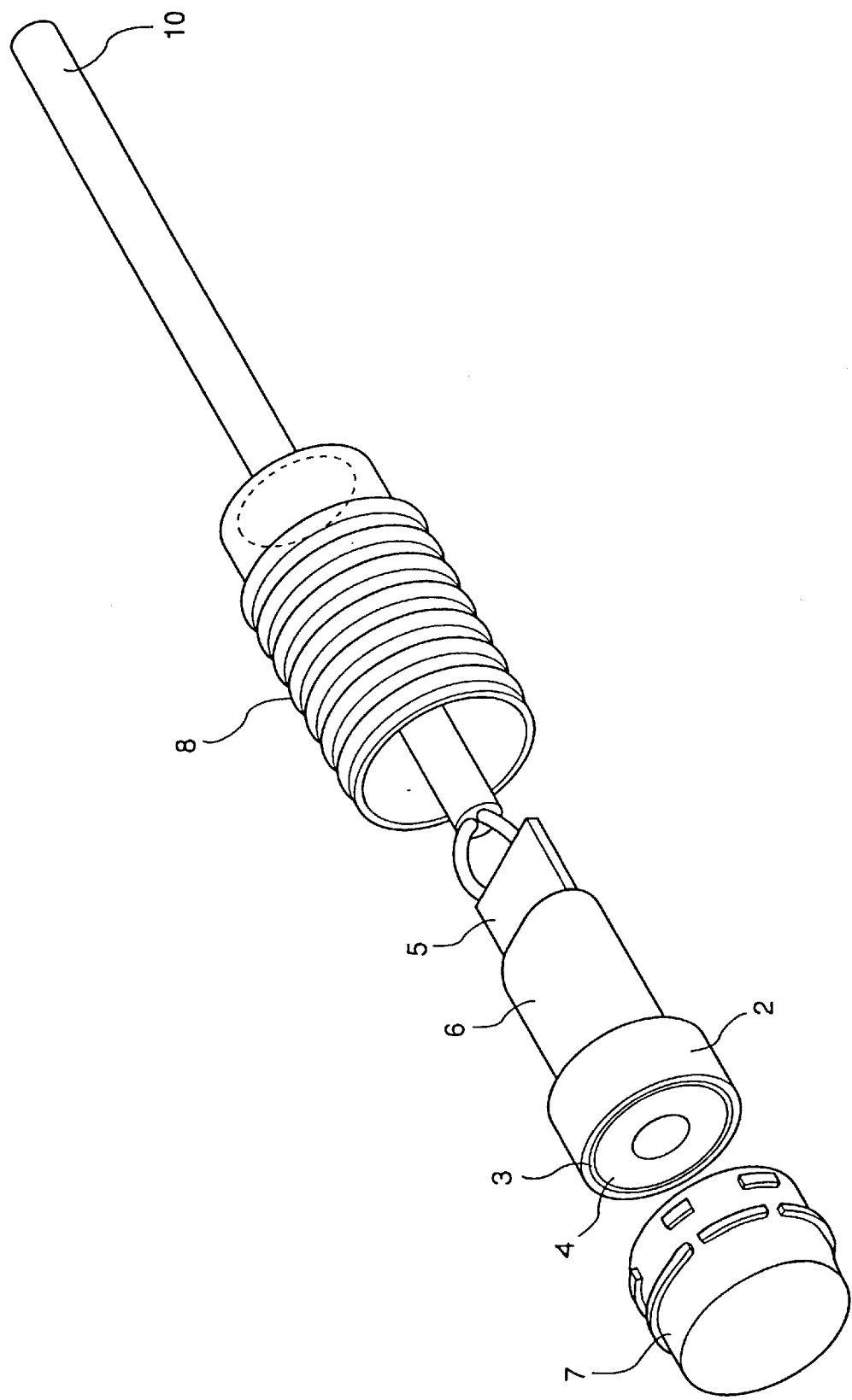
FIG. 31 shows a structure of a proximity sensor, before assembly, of a tenth embodiment.
Figure 32:
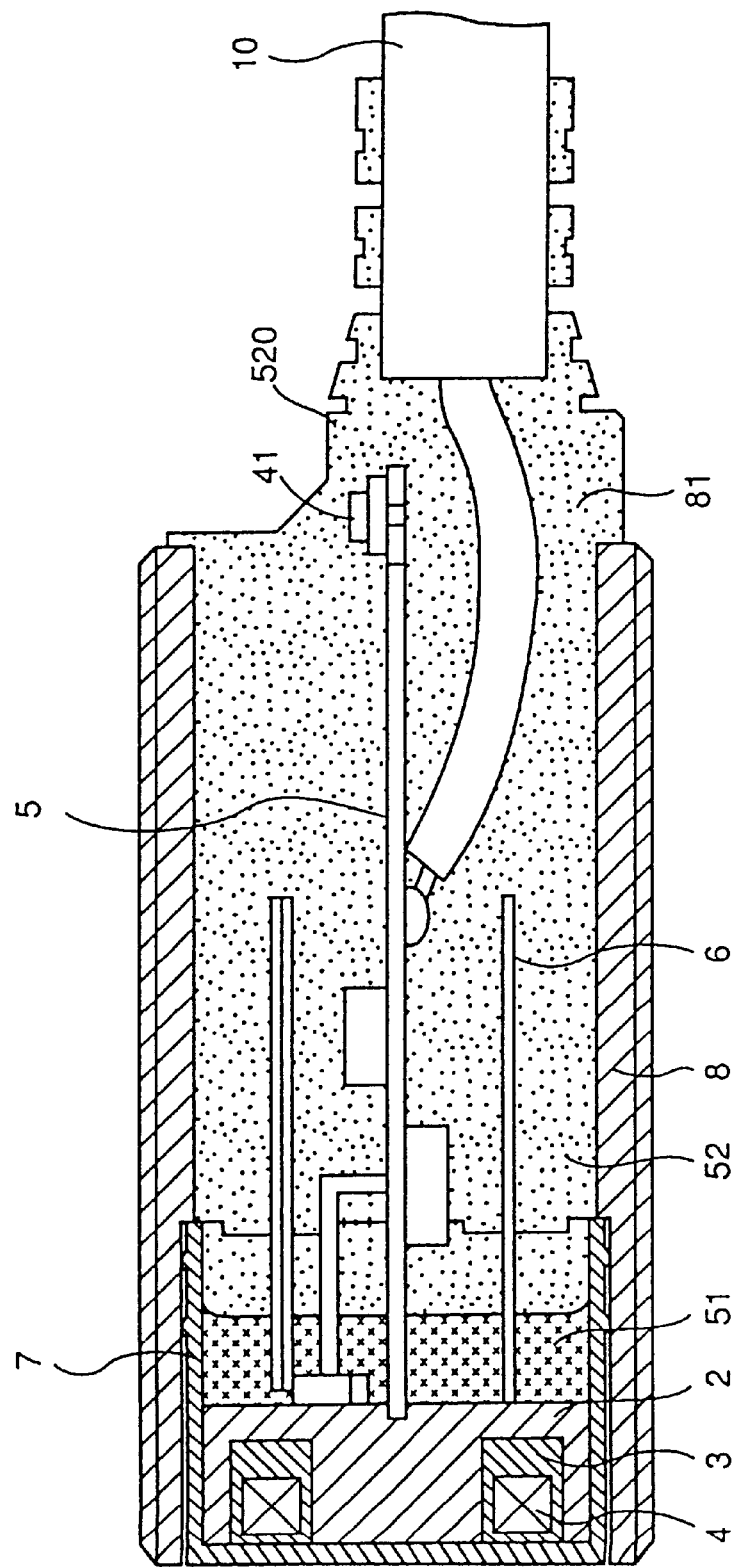
FIG. 32 is a cross section of the proximity sensor of the tenth embodiment.

A proximity sensor of a tenth embodiment of the invention will be described below. The proximity sensor which will be described below as the tenth embodiment is an example of a structure in which a clamp portion holding a code connected to a printed board is integrally formed of filler resin. FIG. 31 shows a structure of the proximity sensor before assembly of the tenth embodiment. FIG. 32 is a cross section of the proximity sensor of the tenth embodiment. In the following description, the proximity sensor of the tenth embodiment will be described mainly in connection with a difference from the first embodiment.

The proximity sensor of the tenth embodiment differs from the first embodiment in the following points. A clamp portion 520 is formed of filler resin 52. The configuration of clamp portion 520 formed of filler resin 52 is shown in FIG. 32. A structure before supply of filler resin 52 is shown in FIG. 31.

Description will now be given on a method of manufacturing metal casing 8 of the tenth embodiment. Core 2, to which coil 4, printed board 5 and shield film 6 are attached, is disposed in coil casing 7, and the assembly is filled with coil unit sealing resin 51. Coil casing 7 is forcedly fitted into metal casing 8, and then a whole structure including metal casing 8 is put in molding dies. Metal casing 8 in the dies is pinched by the dies. Metal casing 8 thus pinched is completely wrapped and covered with the molding dies.

Air in metal casing 8 is externally extracted with an air bend provided at the molding dies through a gap between coil casing 7 and metal casing 8 (or apertures formed at coil casing 7). Filler resin 52 is supplied into molding dies. Thereby, as shown in FIG. 32, the portion holding code 10 is integrally formed as clamp portion 520. The configuration of clamp portion 520 thus formed is similar to that of clamp portion 9 in the first embodiment. In this case, filler resin 52 is transparent so that light beams emitted from display element 41 can be externally visible.

According to the tenth embodiment, the resin filling operation can be performed extremely easily and reliably in a short time, as can be done in the first embodiment. Owing to integral formation or molding of clamp portion 520 made of filler resin 52, parts of the proximity sensor can be reduced in number.

Figure 33:
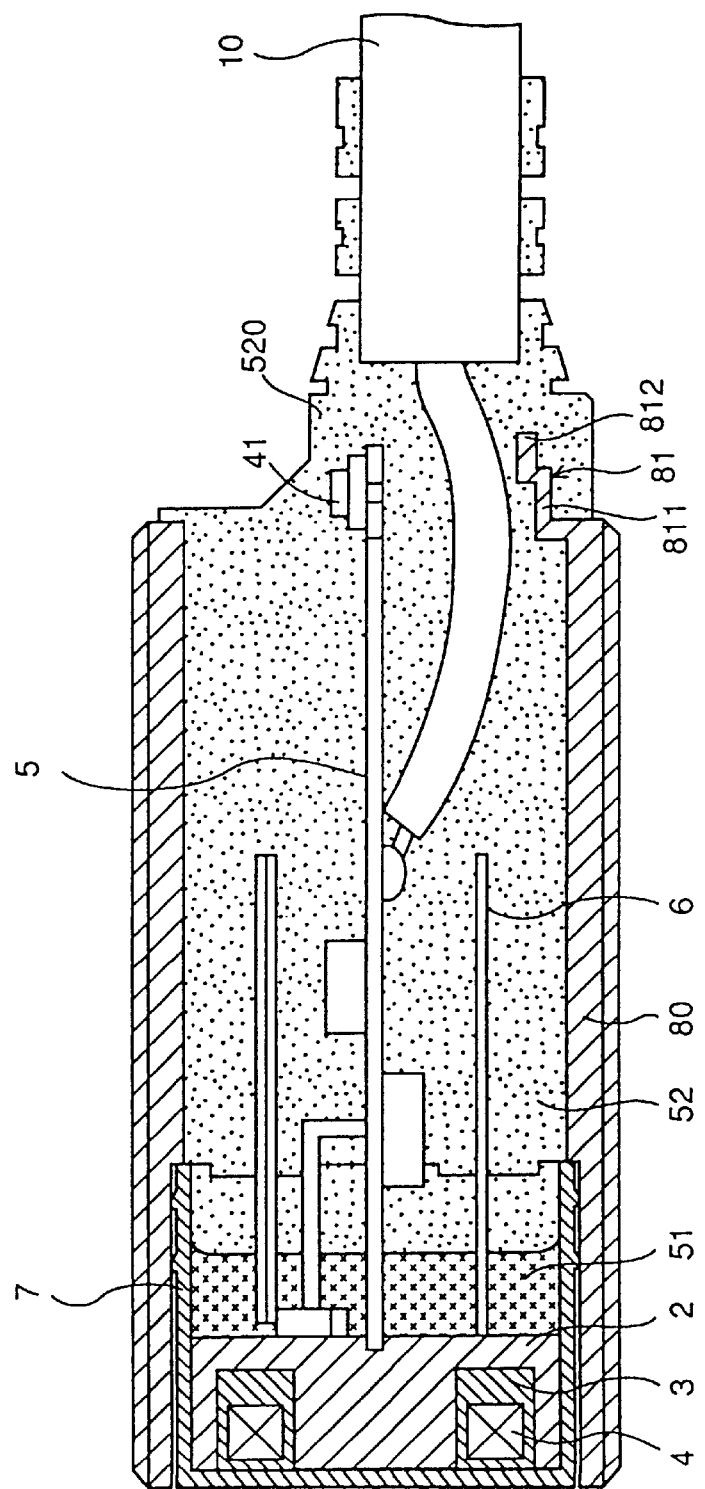
FIG. 33 shows a structure of a proximity sensor, before assembly, of an eleventh embodiment.
Figure 34:
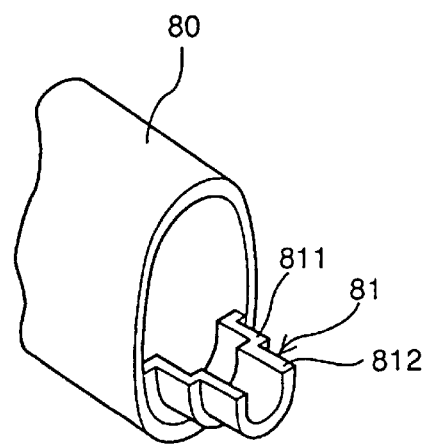
FIG. 34 is a perspective view of a metal casing of the proximity sensor of the eleventh embodiment.
Figure 35:
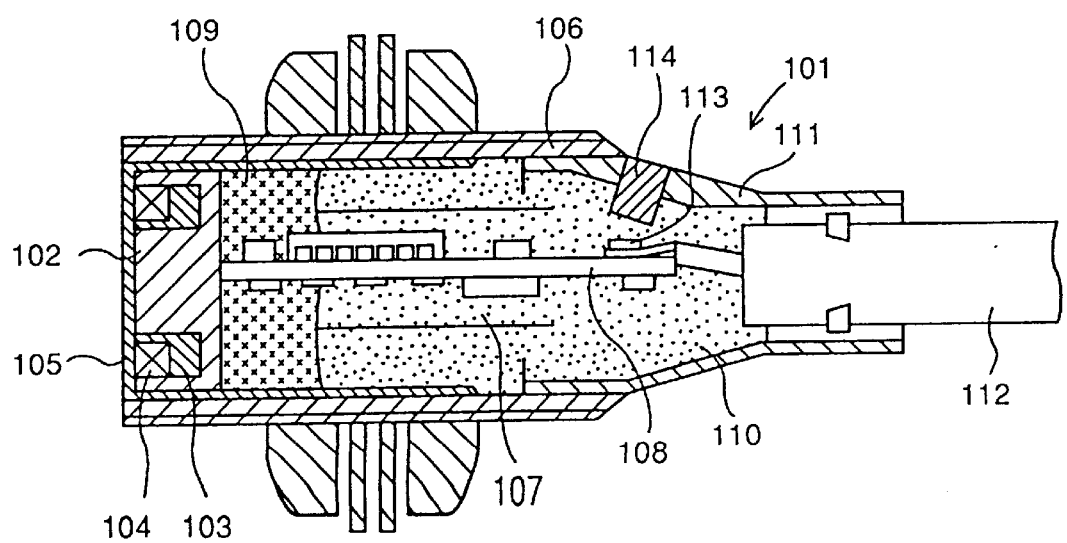
FIG. 35 is a cross section of an example of a conventional proximity sensor.

A proximity sensor of an eleventh embodiment of the invention will be described below. The proximity sensor of the eleventh embodiment is another example of the structure in which clamp portion 520 is integrally formed of filler resin 52, as is done in the tenth embodiment. FIG. 33 is a cross section of the proximity sensor of the eleventh embodiment. FIG. 34 is a perspective view of a sensor casing of the proximity sensor of the eleventh embodiment. In the following description, the proximity sensor of the eleventh embodiment will be described below mainly in connection with a difference from the tenth embodiment.

The proximity sensor of the eleventh embodiment differs from the tenth embodiment in the following points. A sensor casing 80, which corresponds to metal casing 8 in the tenth embodiment, is made of resin. Sensor casing 80 has an axially extended portion at an end forming clamp portion 520. This extended portion has a smaller diameter than the main body. In this embodiment, the extended portion of sensor casing 80 has a step-wise form and includes two portions of different diameters. More specifically, the extended portion forms a stepped portion at the end portion of sensor casing 80, and the extended portion is formed to provide a first extension 811 of a smaller diameter than the main body of sensor casing 80 and a second extension 812 of a smaller diameter than first extension 811. The extended portion has a semicircular section. The extended portion is covered with clamp portion 520 formed of filler resin 52.

Since the extended portion provides the stepped portion at the end portion of sensor casing 80, the stepped portion prevents disengaging of the portion formed of filler resin 52 from sensor casing 80.

INDUSTRIAL APPLICABILITY

As described above, the invention is suitable to various kinds of electronic components such as a proximity sensor, in which an electronic part such as a coil is held in a cylindrical casing and the casing is filled with resin.

What is claimed is:

1. An electronic component comprising:
 a cover formed of a cylindrical member having a closed bottom,
 said cover including:
  first linear projections intermittently arranged at an outer peripheral surface of said cover, and
  second linear projections intermittently arranged and forming air discharge grooves at positions corresponding to said first linear projections.

2. The electronic component according to claim 1, wherein
 said cover further includes a groove formed between said first linear projections and said second linear projections for accumulating resin.

3. An electronic component having a casing accommodating an electronic part, said casing having two opposite end portions and comprising:
 a resin inlet arranged at one end portion of said casing;
 a resin supplied through said resin inlet and filling said casing;
 an opening arranged at the other end portion of said casing;
 a cover fitted into and covering said opening; and
 a projection formed at a portion of said cover opposed to an inner surface of said opening.

4. The electronic component according to claim 3, wherein
 said cover is filled with a primary filler resin.

5. The electronic component according to claim 3, wherein
 said cover includes an electronic part holding portion for holding said electronic part, and said electronic part holding portion is filled with a primary filler resin.

* * * * *

UNITED STATES PATENT AND TRADEMARK OFFICE
CERTIFICATE OF CORRECTION

PATENT NO. : 6,025,562
DATED : February 15, 2000
INVENTOR(S) : Takeski SHIMIZU.

It is certified that error appears in the above-indentified patent and that said Letters Patent is hereby corrected as shown below:

Column 2, line 67, delete "II" and replace with --I-I--.
Column 3, line 2, delete "B-B" and replace with --II-II--.
Column 4, line 50, delete "II" and replace with --I-I--.
Column 4, line 51, delete "B-B" and replace with --II-II--.
Column 4, line 53, delete "÷tal" and replace with --metal--.

Signed and Sealed this

Seventeenth Day of April, 2001

NICHOLAS P. GODICI

Attest:

Attesting Officer    Acting Director of the United States Patent and Trademark Office